(12) United States Patent
Nemoto et al.

(10) Patent No.: US 6,791,121 B2
(45) Date of Patent: Sep. 14, 2004

(54) SEMICONDUCTOR DEVICE AND METHOD OF MANUFACTURING THE SAME

(75) Inventors: Michio Nemoto, Nagano (JP); Akira Nishiura, Nagano (JP); Tatsuya Naito, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/083,673

(22) Filed: Feb. 25, 2002

(65) Prior Publication Data

US 2002/0130331 A1 Sep. 19, 2002

(30) Foreign Application Priority Data

Feb. 23, 2001 (JP) .......................................... 2001-048631
Aug. 29, 2001 (JP) .......................................... 2001-259928

(51) Int. Cl.[7] ............................................... H01L 29/36
(52) U.S. Cl. ........................ 257/109; 257/480; 257/486
(58) Field of Search ................................. 257/109, 480, 257/486, 493; 438/379, 570

(56) References Cited

U.S. PATENT DOCUMENTS 5,223,442 A * 6/1993 Kitagawa et al. ........... 438/137

FOREIGN PATENT DOCUMENTS

| JP | 2000-223720 | 8/2000 |
| JP | 2000223720 | * 8/2000 |
| JP | 2000323488 | * 11/2000 |

* cited by examiner

Primary Examiner—Nathan J. Flynn
Assistant Examiner—Leonardo Andújar
(74) Attorney, Agent, or Firm—Rossi & Associates

(57) ABSTRACT

A semiconductor device, such as a pin diode, includes a first drift layer, a second drift layer, an anode layer on the first drift layer, and a buffer layer formed between the first and second drift layers. The shortest distance from the pn-junction between the anode layer and the buffer layer, and the thickness of the buffer layer are set at the respective values at which a high breakdown voltage is obtained, while reducing the tradeoff relation between the soft recovery and the fast and low-loss reverse recovery.

25 Claims, 20 Drawing Sheets

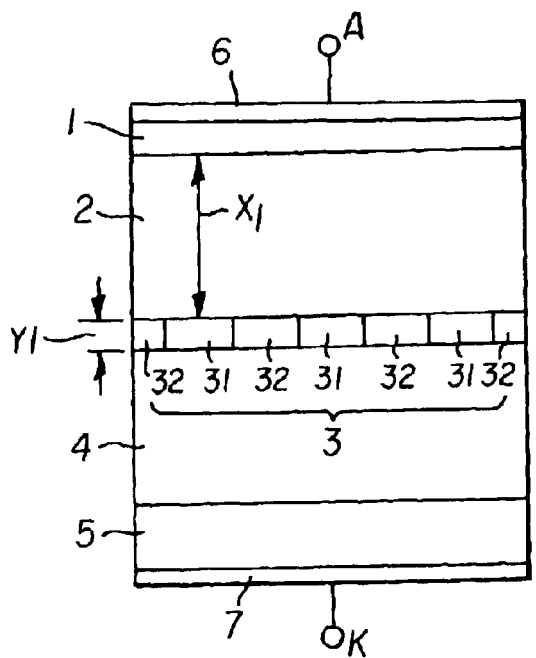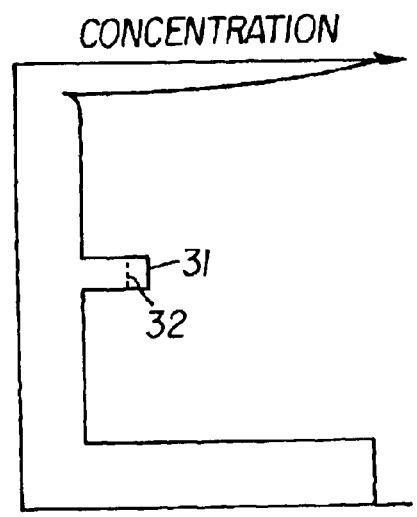
FIG. 11a
FIG. 11b
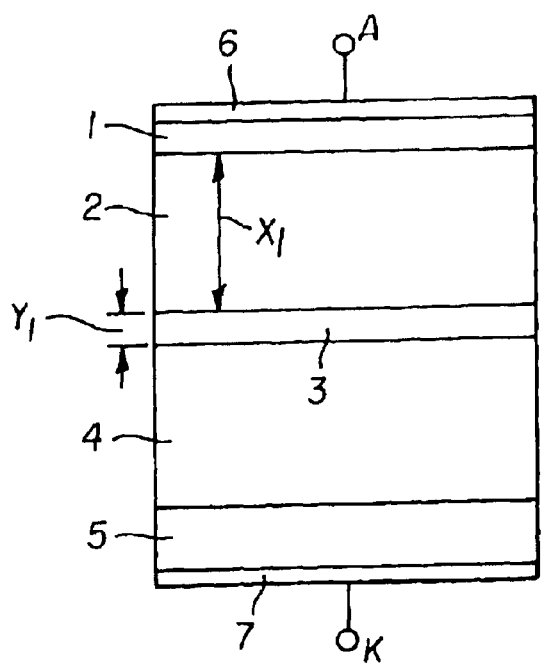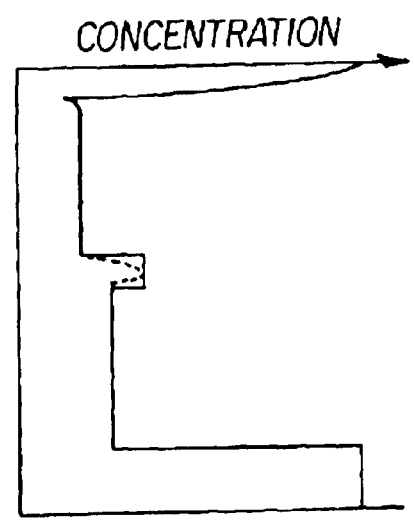
FIG. 12a
FIG. 12b

SEMICONDUCTOR DEVICE AND METHOD OF MANUFACTURING THE SAME

BACKGROUND

The present invention relates to semiconductor devices such as diodes. FIG. 25 is a cross sectional view of a conventional pin diode. Referring now to FIG. 25, the conventional pin diode includes a first n-type semiconductor layer working as an n-type cathode layer 55 with low specific resistance, and a very resistive second n-type semiconductor layer grown epitaxially on the first n-type semiconductor layer. The surface of the second n-type semiconductor layer is mirror finished, a thermal oxide film is coated on the mirror finished surface of the second n-type semiconductor layer, the thermal oxide film is patterned, and a p-type anode layer 51 is formed in the surface portion of the second n-type semiconductor layer. The portion of the second n-type semiconductor layer, where no p-type anode layer 51 is formed, works as an n-type drift layer 58. Thus, an epitaxial substrate 200 is obtained. A heavy metal such as platinum is diffused for controlling the carrier lifetime. An anode electrode 56 and a cathode electrode 57 are formed by metallizing the surface of p-type anode layer 51 and the other surface (back surface) of n-type cathode layer 55.

Although not illustrated, an FZ substrate (bulk substrate) and such another type of substrate are used in substitution for epitaxial substrate 200 described above, and the constituent semiconductor layers are formed by ion implantation and by subsequent thermal drive. In this case, a p-type anode layer is formed in one surface portion of an n-type semiconductor substrate by diffusion, and an n-type cathode layer is formed in another surface portion of the n-type semiconductor substrate by ion implantation and by subsequent thermal derive. The portion of the n-type semiconductor substrate, where neither p-type anode layer nor n-type cathode layer is formed, works as an n-type drift layer.

After diffusing a heavy metal such as platinum for controlling the carrier lifetime, an anode electrode and a cathode electrode are formed on the p-type anode layer 51 and n-type cathode layer 55, respectively, by metalization.

When the conventional pin diode used widely in these days switches from the ON-state to the OFF-state, a high transient current, the so-called reverse recovery current, flows in the opposite direction. The electrical loss, that is the product of the high reverse recovery current and the reverse recovery voltage, is high. It is very necessary to reduce the reverse recovery loss and to increase the switching speed of the diodes.

During reverse recovery, the electrical duties such as the applied voltage, the current and the losses are heavier than those in the steady state. Increase of the steady state current or increase of the voltage in the reverse blocking state causes heavy electrical duties, further causing breakdown of the diode sometimes. For obtaining a very reliable diode for electric power use, it is very necessary to improve the reverse recovery withstanding capability so that the diode may endure the heavy electrical duties.

To improve the reverse recovery characteristics and the reverse recovery withstanding capability, control of the minority carrier lifetime using heavy metal diffusion or electron beam irradiation is employed widely in these days. By shortening the minority carrier lifetime, the total carrier concentration in the steady state is reduced, the concentration of the carriers swept out during reverse recovery by the expanding space charge region is reduced, the reverse recovery time is shortened, the peak reverse recovery current is reduced, and the reverse recovery charge amount is reduced so that the reverse recovery loss may be reduced.

By reducing the hole concentration, the strength of the electric field caused during reverse recovery by the holes flowing through the space charge region is relaxed, and the duties caused during the reverse recovery are reduced so that the reverse recovery withstanding capability may be improved and the diode may not be broken down.

It is also important to provide the diodes with soft recovery characteristics. For the sake of environmental safety, it has been required to reduce the electromagnetic noises caused from power electronic instruments and apparatuses. One method that meets the demand described above makes the reverse recovery current of the diode behave softly to prevent the reverse recovery current and the reverse recovery voltage from oscillating so that the electromagnetic noises caused by the oscillation of the reverse recovery current or the reverse recovery voltage may be reduced.

One means for providing the diode with soft recovery characteristics is a soft recovery structure that suppresses the efficiency of minority carrier injection from the anode side. Typical diodes having the soft recovery structure include a merged pin/Schottky diode (MPS) disclosed in B. J. Baliga, "The Pinch Rectifier", IEEE Electron. Dev. Lett., ED-5, p. 194, 1984 and a soft and fast recovery diode (SFD) disclosed in M. Mort, et. al., "A Novel Soft and Fast Recovery Diode (SFD) with Thin P-layer Formed by Al—Si Electrode", Proceedings of ISPSD '91, pp. 113–117, 1991.

As described in M. Nemoto, et. al., "An Advanced FWD Design Concept with Superior Soft Reverse Recovery Characteristics", Proceedings of ISPSD 2000, pp. 119–122, 2000, there exists a tradeoff relation between the soft recovery and the fast and low-loss reverse recovery.

To provide the diode with soft recovery characteristics, the total amount of the carriers accumulated in the drift layer in the ON-state of the diode is increased so that the amount of the minority carriers accumulated on the cathode side may increase. As the amount of the minority carriers accumulated on the cathode side increases, many of the minority carriers may remain on the cathode side while the space charge region is expanding from the anode side to the cathode side at the time of reverse recovery. As the number of the minority carriers remaining on the cathode side while the space charge region is expanding from the anode side to the cathode side increases, the reduction rate of the reverse recovery current dir/dt, the so-called reverse-recovery-current reduction-rate, is reduced.

However, when too many carriers are accumulated in the drift layer in the ON-state of the diode, the reverse recovery loss increases and it takes a long time until the reverse recovery ends; that is the reverse recovery time is elongated. On the other hand, a fast and low-loss diode is obtained by controlling the carrier lifetime, which introduces a lifetime killer uniformly into the drift layer, or by thinning the drift layer to reduce the amount of carriers accumulated in the drift layer in the ON-state of the diode. However, as the amount of carriers accumulated in the drift layer is reduced, the amount of the minority carriers accumulated on the cathode side is also reduced, causing the so-called snappy and hard recovery, in which the reverse-recovery-current reduction-rate dir/dt is large. During the snappy and hard recovery, the reverse recovery voltage and the reverse recovery current sometimes oscillate.

Soft recovery is realized by the low-injection-type diodes, such as the MPS and the SFD disclosed in the Bagalia and Mort references. However, lowering of the breakdown voltage and increase of the leakage current under the applied reverse bias voltage are caused more often in the low-injection-type diodes than in the pin diode having the drift layer of the same thickness due to the Schottky junction or the lightly doped anode layer.

Local lifetime control conducted by irradiating a particle ray of a light ion such as proton and helium causes high manufacturing costs, since the cost of irradiation per a wafer is high. If one tries to reduce the tradeoff relation between the fast and low-loss reverse recover and the soft recovery by employing the low-injection-type diode having the MPS structure or the SFD structure or by thinning the drift layer and by employing the local lifetime control, a space for accumulating enough carriers will not be left on the cathode side of the drift layer, causing hard reverse recovery, in which the reverse recovery current and the reverse recovery voltage oscillate. Furthermore, it will be very difficult to obtain a designed breakdown voltage.

In view of the foregoing, there is a need for a semiconductor device that obviates the problems described above. In particular, there is a need for a semiconductor device that facilitates obtaining a designed breakdown voltage while reducing the tradeoff relation between the fast and low-loss reverse recovery and the soft recovery. The present invention addresses these needs.

SUMMARY OF THE INVENTION

According to a first aspect of the invention, there is provided a semiconductor device including: a first semiconductor layer of a first conductivity type having a first major surface and a second major surface; a second semiconductor layer of a second conductivity type on the first major surface of the first semiconductor layer, the second semiconductor layer being doped more heavily than the first semiconductor layer; a third semiconductor layer of the first conductivity type on the second major surface of the first semiconductor layer, the third semiconductor layer being doped more heavily than the first semiconductor layer; and a fourth semiconductor layer of the first conductivity type extending across the first semiconductor layer, the fourth semiconductor layer being spaced apart from the second semiconductor layer and the third semiconductor layer, the fourth semiconductor layer being doped more heavily than the first semiconductor layer.

The fourth semiconductor layer can be formed uniformly across the first semiconductor layer. The fourth semiconductor layer can include a plurality of regions. The impurity concentration in the portion of the first semiconductor layer between the second semiconductor layer and the fourth semiconductor layer can be lower than the impurity concentration in the portion of the first semiconductor layer between the third semiconductor layer and the fourth semiconductor layer.

According to a second aspect of the invention, there is provided a semiconductor device including: a drift layer of a first conductivity type having a first major surface and a second major surface; an anode layer of a second conductivity type on the first major surface of the drift layer, the anode layer being doped more heavily than the drift layer; a cathode layer of the first conductivity type on the second major surface of the drift layer, the cathode layer being doped more heavily than the drift layer; and a buffer layer of the first conductivity type extending across the drift layer, the buffer layer being spaced apart from the anode layer and the cathode layer, the buffer layer being doped more heavily than the drift layer.

The buffer layer can be formed uniformly across the first semiconductor layer. The buffer layer can include a plurality of regions. The impurity concentration in the portion of the drift layer between the anode layer and the buffer layer can be lower than the impurity concentration in the portion of the drift layer between the cathode layer and the buffer layer.

The shortest distance $X_1$ from the pn-junction between the anode layer and the drift layer to the edge of the buffer layer on the side of the anode can be expressed by the following relational expression (1):

$$0.3 \leq X_1/\{(BV\,\epsilon_s)/q[(J_F/q\,v_{sat})+N_D]\}^{1/2} \leq 1.6 \qquad (1),$$

where BV is the breakdown voltage of the semiconductor device, $\epsilon_s$ is the dielectric permittivity of the semiconductor, q is the elementary charge quantity, $J_F$ is the rated current density of the semiconductor device, $v_{sat}$ is the carrier saturation velocity, and $N_D$ is the concentration of the impurity of the first conductivity type in the drift layer.

More preferably, the shortest distance $X_1$ from the pn-junction between the anode layer and the drift layer to the edge of the buffer layer on the side of the anode can be expressed by the following relational expression (2):

$$0.8 \leq X_1/\{(BV\,\epsilon_s)/q[(J_F/q\,v_{sat})+N_D]\}^{1/2} \leq 1.2 \qquad (2),$$

where, BV is the breakdown voltage of the semiconductor device, $\epsilon_s$ is the dielectric permittivity of the semiconductor, q is the elementary charge quantity, $J_F$ is the rated current density of the semiconductor device, $v_{sat}$ is the carrier saturation velocity, and $N_D$ is the concentration of the impurity of the first conductivity type in the drift layer. The thickness $Y_1$ of the buffer layer and the average impurity concentration $N_{D2}$ of the buffer layer can be related with each other by the following relational expression (3):

$$Y_1/\{[X_1^2+2\epsilon_s(V_{CC}+V_{PT})/q\,N_{D2}]^{1/2}-X_1\} \leq 2 \qquad (3),$$

where $X_1$ is the shortest distance from the pn-junction between the anode layer and the drift layer to the edge of the buffer layer on the side of the anode, $V_{CC}$ is the half value of the breakdown voltage of the semiconductor device, $V_{PT}$ is the voltage, at which the depletion layer contacts the buffer layer of the first conductivity type, $\epsilon_s$ is the dielectric permeability of the semiconductor, and q is the elementary charge quantity.

The buffer layer can include a plurality of selectively formed island-shaped regions. The buffer layer can include a plurality of selectively formed stripe-shaped regions.

According to a third aspect of the invention, there is provides a semiconductor device including: a bulk wafer including a first drift layer of a first conductivity type, the bulk wafer having a first major surface and a second major surface; a buffer layer of the first conductivity type on the first major surface of the bulk wafer, the buffer layer being doped more heavily than the first drift layer by implanting an impurity of the first conductivity type; a second drift layer of the first conductivity type epitaxially grown on the buffer layer, the second drift layer being doped more lightly than the buffer layer; an anode layer formed by implanting an impurity of a second conductivity type into the second drift layer; an anode electrode on the anode layer; a cathode layer on the surface of the bulk wafer exposed by grinding back the bulk wafer for a predetermined depth from the second major surface thereof, the cathode layer being doped more heavily than the first drift layer by implanting an impurity of the first conductivity type; and a cathode electrode on the cathode layer.

According to a fourth aspect of the invention, there is provided a method of manufacturing a semiconductor device, the method including the steps of: implanting an impurity of a first conductivity type into the first major surface of a bulk wafer including a first drift layer of the first conductivity type, by which to form a buffer layer of the first conductivity type doped more heavily than the first drift layer; growing epitaxially a second drift layer of the first conductivity type on the buffer layer, the second drift layer being doped more lightly than the buffer layer; implanting an impurity of a second conductivity type into the second drift layer, by which to form an anode layer; forming an anode electrode on the anode layer; grinding back the bulk wafer from the second major surface thereof, by which to remove the portion of the bulk wafer for a predetermined depth from the second major surface; implanting an impurity of the first conductivity type to the surface of the bulk wafer exposed by the grinding back, by which to form a cathode layer doped more heavily than the first drift layer; and forming a cathode electrode on the cathode layer.

BRIEF DESCRIPTION OF THE DRAWINGS

These and other features, aspects, and advantages of the present invention will become more apparent from the following description, appended claims, and accompanying exemplary embodiments shown in the drawings, which are briefly described below.

FIG. 11(a) is a cross sectional view of a semiconductor device according to the third embodiment of the invention.

FIG. 11(b) shows the impurity distribution profile across the semiconductor device shown in FIG. 11(a).

FIG. 12(a) is a cross sectional view of a semiconductor device according to the fourth embodiment of the invention.

FIG. 12(b) shows the impurity distribution profile across the semiconductor device shown in FIG. 12(a).

FIG. 20(*b*) is a perspective view of another diode according to the ninth embodiment of the invention having the SFD structure as shown in FIG. 19(*b*) and including a drift laminate including the island-shaped n-type buffer regions as shown in FIG. 13(*a*).

FIG. 24(*b*) is a cross sectional view of another semiconductor device according to the eleventh embodiment of the invention.

DETAILED DESCRIPTION

Now the invention will be explained in detail hereinafter with reference to the accompanied drawing figures which illustrate the preferred embodiments of the invention. In the following descriptions, the first conductivity type is an n-type and the second conductivity type is a p-type.

Figure 1:
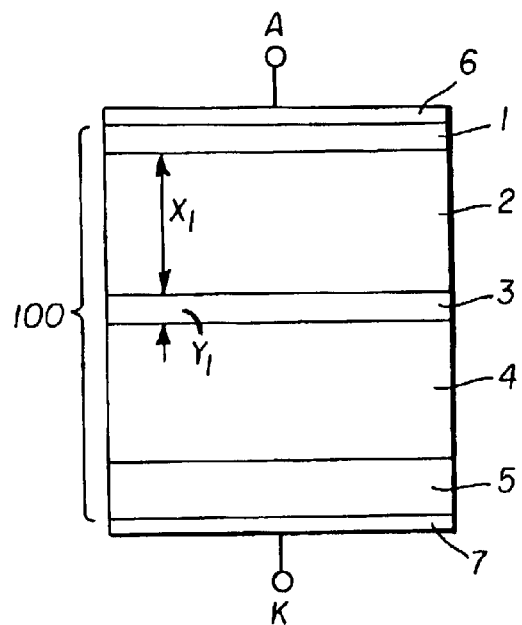
FIG. 1 is a cross sectional view of a semiconductor device according to the first embodiment of the invention.

FIG. 1 is a cross sectional view of a semiconductor device according to a first embodiment of the invention. FIG. 1 shows the active region of a pin diode, which includes an n-type buffer layer. The breakdown withstanding region of the pin diode is omitted from the figure. The pin diode according to the first embodiment is formed in the following way. A second n-type drift layer 4 is epitaxially grown on an n-type semiconductor substrate doped, for example, with Sb (antimony) and exhibiting low specific resistance of 0.01 Ω-cm. The n-type semiconductor substrate will be an n-type cathode layer 5. Second n-type drift layer 4 is 55 $\mu$m in thickness, doped, for example, with P (phosphorus), and exhibiting specific resistance of 55 Ω-cm. Then, an n-type buffer layer 3 is epitaxially grown on second n-type drift layer 4. The n-type buffer layer 3 is 5 $\mu$m in thickness, doped, for example, with P, and exhibiting specific resistance of 5 Ω-cm. Then, an n-type semiconductor layer, which will be a first n-type drift layer 2 and a p-type anode layer 1, is epitaxially grown on n-type buffer layer 3. The n-type semiconductor layer is 60 $\mu$m in thickness, doped, for example, with P, and exhibiting specific resistance of 55 Ω-cm. Then, mirror finish is applied to the surfaces of the semiconductor specimen formed so far, and the semiconductor process as conducted on the usual epitaxial substrate is conducted. A thermal oxide film is formed, and the formed thermal oxide film is patterned. Then, a p-type anode layer 1 of 5 $\mu$m in thickness is formed by ion implantation and by subsequent thermal drive in the surface portion of the n-type semiconductor layer of 60 $\mu$m in thickness. The portion of the n-type semiconductor layer, in which p-type anode layer 1 is not formed, will be working as a first n-type drift layer 2.

The shortest distance $X_1$ from the pn-junction between p-type anode layer 1 and first n-type drift layer 2 to buffer layer 3 and the thickness $Y_1$ of n-type buffer layer 3 are described in FIG. 1. In the figure, $X_1$, which is the thickness of first n-type drift layer 2, is 55 $\mu$m, and $Y_1$ is 5 $\mu$m. Hereinafter, first n-type drift layer 2, n-type buffer layer 3 and the second drift layer 4 will be referred to collectively an "n-type drift laminate" or simply as a "drift laminate". The n-type cathode layer 5, second n-type drift layer 4, n-type buffer layer 3, and the foregoing n-type semiconductor layer constitute an epitaxially grown semiconductor substrate 100, hereinafter referred to as an "epitaxial substrate".

Figure 25:
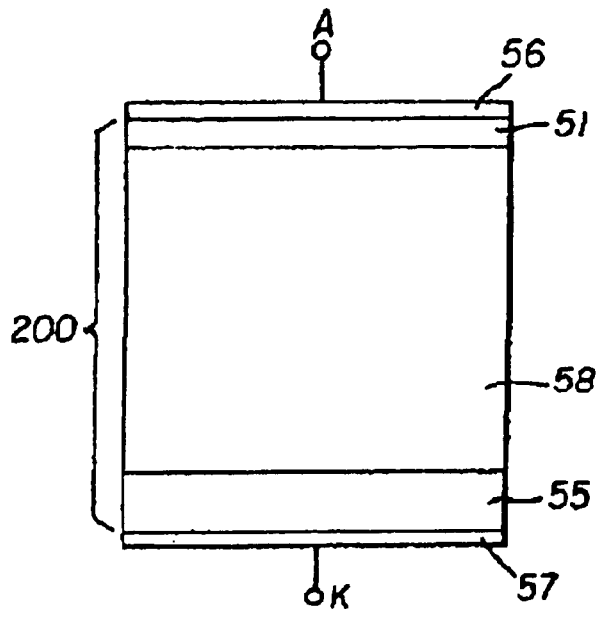
FIG. 25 is a cross sectional view of a conventional pin diode.

A heavy metal such as platinum is diffused for controlling the carrier lifetime. An anode electrode 6 and a cathode electrode 7 are formed by metalization on the surface of p-type anode layer 1 and the surface (back surface) of n-type cathode layer 5. An anode terminal A and a cathode terminal K are connected to the respective electrodes 6 and 7. Thus, the pin diode according to the first embodiment of the invention is manufactured in the same way as the conventional pin diode shown in FIG. 25 except for controlling the doping concentrations during the epitaxial growth steps. Alternatively, the carrier lifetime may be controlled by irradiating an electron beam or light ion spices including He ion.

By setting the foregoing $X_1$ and $Y_1$ in the respective predetermined ranges described later, the tradeoff relation between the fast and low-loss reverse recovery and the soft recovery is reduced while obtaining a certain breakdown voltage.

Figure 2:
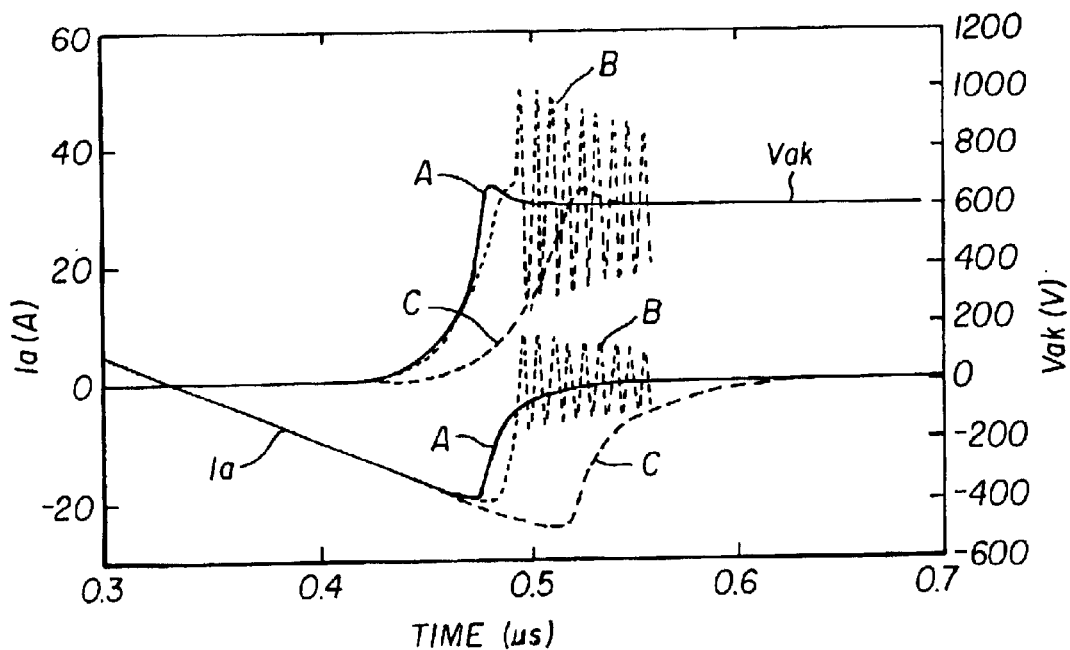
FIG. 2 is a graph describing the reverse-recovery wave forms of the pin diode according to the first embodiment and the conventional pin diode at the room temperature.

FIG. 2 is a graph describing the reverse-recovery wave forms of the pin diode according to the first embodiment and the conventional pin diode at the room temperature. Hereinafter, the pin diode according to the invention will be referred to as the "present pin diode". In the figure, Ia represents the anode current and $V_{ak}$ the voltage between the anode and cathode. In FIG. 2, the positive voltage represents the reverse bias voltage of the pin diodes. The reverse recovery process starts from the instance, at which the anode current Ia crosses zero to the negative side. The thickness of the n-type drift laminate in the present pin diode A is 115 $\mu$m. The thickness of the n-type drift layer is 115 $\mu$m for the conventional pin diode B and 135 $\mu$m for the other conventional pin diode C. The thickness of the anode layers and the thickness of the cathode layers of the conventional pin diodes are the same with those of the present pin diode. The test conditions include the peak forward current (peak anode current) of 50 A and the reverse bias voltage of 600 V, which is half the breakdown voltage BV of the diodes.

The carrier lifetimes of all the pin diodes tested are controlled by electron beam irradiation such that the forward voltage drop is 1.7 V at the rated current of 50 A (corresponding to the rate current density of 170 A/cm$^2$) at the room temperature. The anode current Ia of the conventional pin diode C including the n-type drift layer of 135 μm in thickness does not oscillate, indicating that the conventional pin diode C conducts soft recovery. In contrast, the conventional pin diode B including the n-type drift layer of 115 μm in thickness conducts hard recovery. In detail, the reverse-recovery-current reduction-rate dir/dt increases drastically (the reverse recovery current reduces drastically) at a certain time, indicating snappy recovery, that is hard recovery, and the reverse recovery current, that is the anode current Ia, which has crossed zero to the negative side, oscillates. Accordingly, the reverse recovery voltage, which is the product (L·(dir/dt)) of the inductance L of the circuit and the reverse-recovery-current reduction-rate dir/dt, increases like spikes and oscillates. In FIG. 2, the oscillation wave forms of the conventional pin diode B including the n-type drift layer of 115 μm in thickness are not shown at 0.55 μs or later for the sake of clear description.

The anode current Ia of the present pin diode A does not oscillate, even though the n-type drift laminate thereof is 115 μm in thickness. That is, the present pin diode A conducts soft recovery. The present pin diode A realizes soft recovery as well as fast and low-loss reverse recovery almost the same with the reverse recovery of the conventional pin diode B, the n-type drift layer thereof is 115 μm in thickness. Thus, the present pin diode A greatly reduces the tradeoff relation between the fast and low-loss reverse recovery and the soft recovery.

The reverse recovery charge quantity Qrr is 2.95 μc for the conventional pin diode C and 1.65 μc for the present pin diode A. The reverse recovery charge quantity Qrr of the present pin diode A is reduced to 55% of that of the conventional pin diode C. Therefore, the present pin diode A improves the reverse recovery characteristics (reverse recovery charge quantity Qrr) thereof greatly.

Figure 3A:
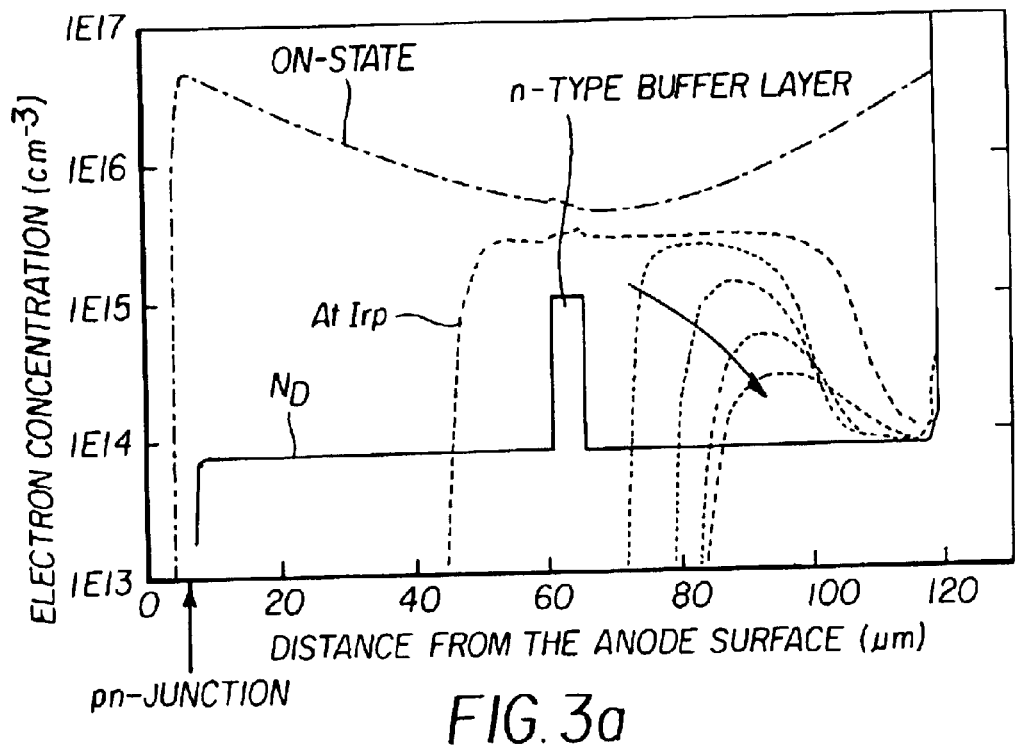
FIG. 3(a) is a graph describing the electron concentration change during the reverse recovery described in FIG. 2 calculated by device simulation for the pin diode according to the first embodiment of the invention.
Figure 3B:
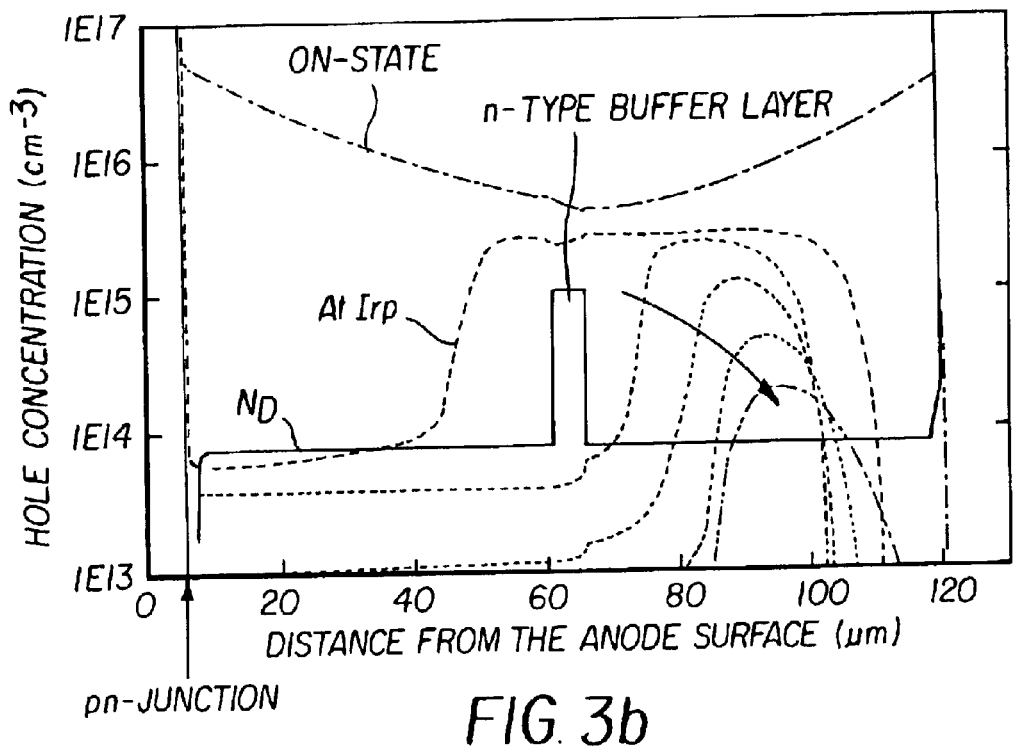
FIG. 3(b) is a graph describing the hole concentration change during the reverse recovery described in FIG. 2 calculated by device simulation for the pin diode according to the first embodiment of the invention.

FIG. 3(a) is a graph describing the electron concentration change during the reverse recovery described in FIG. 2 calculated by device simulation for the present pin diode. FIG. 3(b) is a graph describing the hole concentration change during the reverse recovery described in FIG. 2 calculated by device simulation for the present pin diode. In these figures, the horizontal axis represents the depth from the surface of p-type anode layer 1, and the vertical axis the carrier concentration. In the figures, $N_D$ represents the impurity concentration in the n-type drift laminate, which is the donor concentration. The description 1E13 stands for 1×10$^{13}$. The distance from the anode electrode to the pn-junction (the thickness of the anode layer) is 5 μm., and the thickness of the n-type drift laminate including the n-type buffer layer is 115 μm .

A space charge region (depletion layer) expands from the pn-junction to the n-type drift layer (first n-type drift layer 2 in FIG. 1). After the reverse recovery current exhibits the peak value thereof (at the time of Irp), the space charge region is prevented from expanding once by n-type buffer layer 3 and, then, further expands beyond n-type buffer layer 3 into second n-type drift layer 4 on the side of the cathode. Since n-type buffer layer 3 exists and since the reverse bias voltage is half the breakdown voltage of the pin diode (1200 V), the space charge region stops expanding within second n-type drift layer 4. Then, many carriers remaining on the cathode side of second n-type drift layer 4 recombine to vanish smoothly as indicated by the arrow in FIGS. 3(a) and 3(b). Since sufficient carriers (electrons and holes) survive the reverse recovery process, the reverse-recovery-current reduction-rate dir/dt is suppressed at a low value and soft recovery is realized.

Figure 4A:
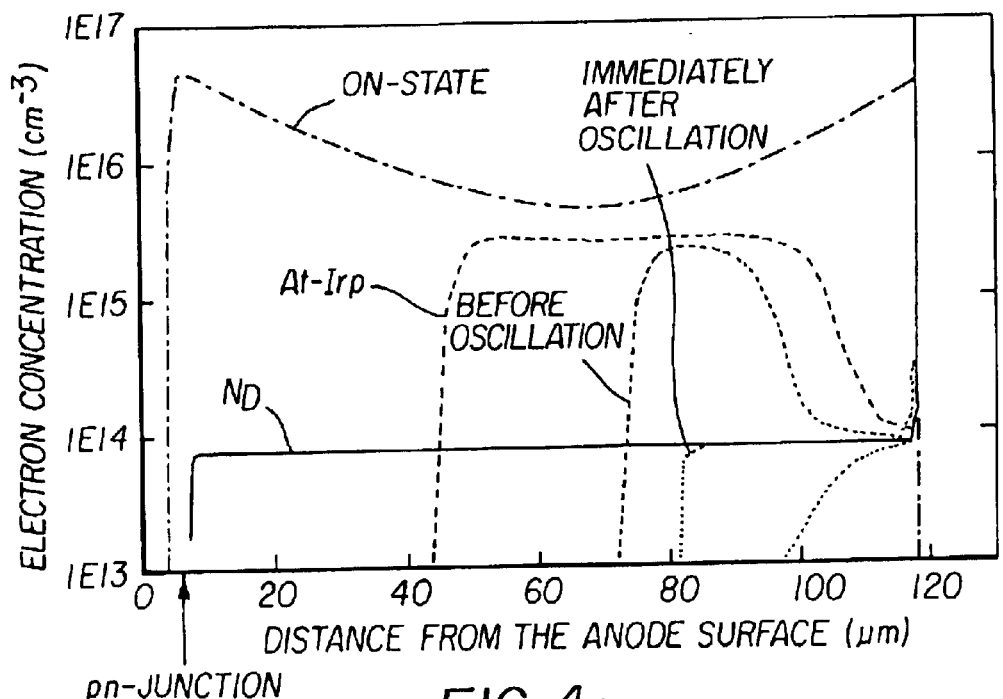
FIG. 4(a) is a graph describing the electron concentration change during the reverse recovery described in FIG. 2 calculated by device simulation for the conventional pin diode B, the n-type drift layer thereof being 115 µm in thickness.
Figure 4B:
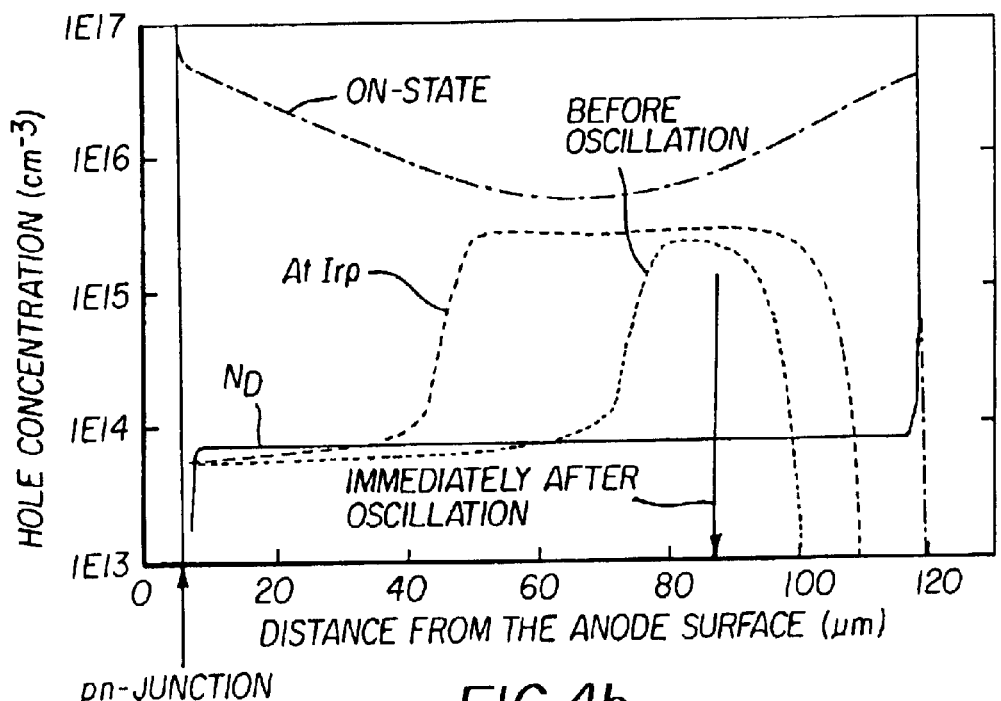
FIG. 4(b) is a graph describing the hole concentration change during the reverse recovery described in FIG. 2 calculated by device simulation for the conventional pin diode B.

FIG. 4(a) is a graph describing the electron concentration change during the reverse recovery described in FIG. 2 calculated by device simulation for the conventional pin diode B, the n-type drift layer thereof is 115 μm in thickness. FIG. 4(b) is a graph describing the hole concentration change during the reverse recovery described in FIG. 2 calculated by device simulation for the conventional pin diode B. FIGS. 4(a) and 4(b) correspond to FIGS. 3(a) and 3(b) for comparing the present pin diode A with the conventional pin diode B.

In FIGS. 4(a) and 4(b), the manner, in which the carriers reduce, is different from the manner, in which the carriers in the region between n-type buffer layer 3 and the cathode layer reduce as shown in FIGS. 3(a) and 3(b). Since the conventional pin diode B does not include any n-type buffer layer, the space charge region expands to the cathode layer without being interrupted. Since the carriers remaining on the cathode side of the n-type drift layer are swept out by the space charge region expanding to the cathode side of the n-type drift layer, the concentration of the remaining charges decreases sharply down to below the donor concentration ND. As a result, the holes (minority carriers) are exhausted from the cathode side of the n-type drift layer.

As FIGS. 4(a) and 4(b) show, the carriers (electrons and holes) accumulated before oscillation is caused are exhausted immediately before the oscillation (almost the same state as immediately after the oscillation). At this instance, the hole concentration is very much lower than 1×10$^{13}$ cm$^{-3}$ pointed by the tip of the arrow in FIG. 4(b). Since the carrier exhaustion is caused abruptly, the reverse-recovery-current reduction-rate dir/dt becomes large, causing hard recovery. As a result, the reverse recovery current and the reverse recovery voltage start oscillating.

Figure 5:
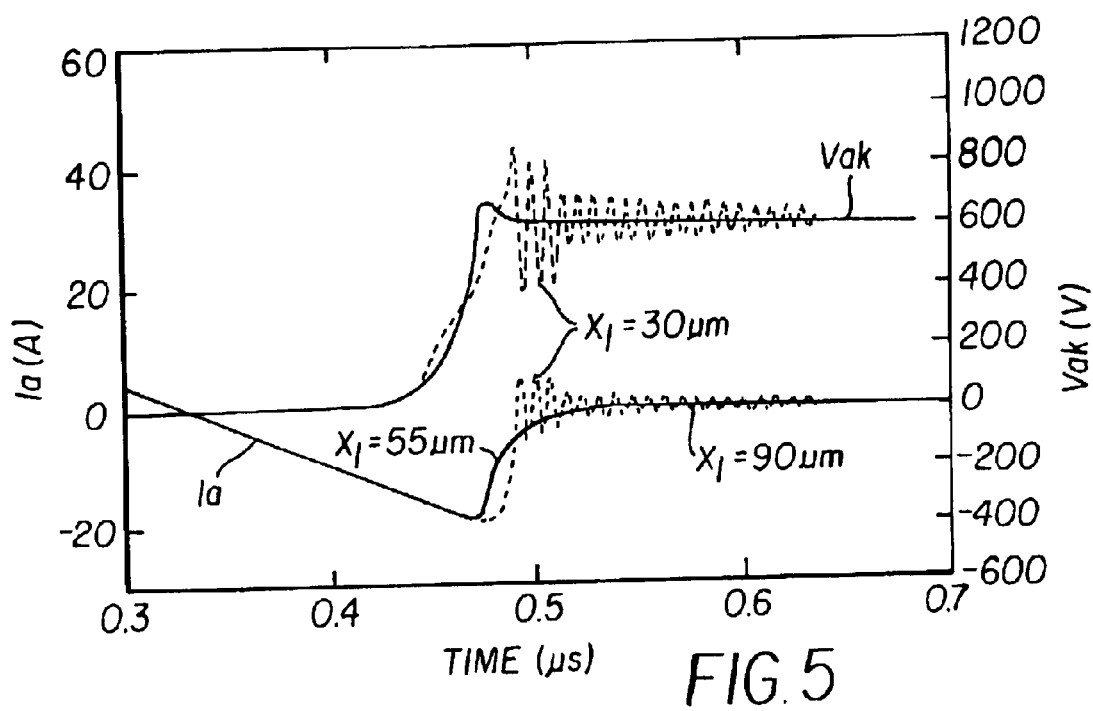
FIG. 5 is a graph comparing the reverse recovery voltages and the reverse recovery currents with the shortest distance $X_1$ from the pn-junction between the p-type anode layer and the n-type drift layer to the n-type buffer layer as a parameter.

FIG. 5 is a graph comparing the reverse recovery voltages and the reverse recovery currents with the shortest distance $X_1$ from the pn-junction between the p-type anode layer and the n-type drift layer to the n-type buffer layer as a parameter. The shortest distance $X_1$ is set at 30 μm, 55 μm, and 90 μm. Oscillation is caused in the present pin diodes A, in which the shortest distances $X_1$ are 30 μm and 90 μm, respectively, although the oscillation is not so vigorous as that in the conventional pin diode B. Thus, the location of n-type buffer layer 3 (the shortest distance $X_1$) affects the soft recovery.

Now the position and the thickness of the n-type buffer layer for realizing soft recovery will be explained. The distance L from the pn-junction to the edge of the space charge region expanding into the n-type drift layer during reverse recovery is expressed by the following equation (4) obtained by solving the Poisson's equation:

$$L=\{(BV\,\epsilon_s)/q[(J_F/q\,v_{sat}+N_D)]\}^{1/2} \qquad (4),$$

where BV is the breakdown voltage of the diode, $\epsilon_s$ the dielectric permittivity of the semiconductor, q the elementary charge quantity, $J_F$ the rated current density of the diode, $v_{sat}$ the carrier saturation velocity, and $N_D$ the concentration of the impurity of the first conductivity type in the drift layer. The term $[(J_F/q\,v_{sat})+N_D]$ corresponds to the charge quantity in the Poisson's equation, and the charge quantity caused by the reverse recovery is put in $(J_F/q\,v_{sat})$.

By setting the breakdown voltage (the avalanche voltage) BV, the rated current density $J_F$, and the impurity concentration $N_D$ in the n-type drift layer at the respective values, the distance L from the pn-junction to the edge of the space charge region expanding into the n-type drift layer, which corresponds to the charge quantity $[(J_F/q\,v_{sat})+N_D]$, is determined by the Poisson's equation. Hereinafter, the distance L is used as an index (distance index) indicating the expansion of the space charge region.

The relation as described below exists between the rated current density $J_F$ and the breakdown voltage BV of the diode. The current density Jii, which causes impact ionization (avalanche state) at the applied voltage $V_{ak}$ is expressed by the following equation:

$$V_{ak}=5.3\times10^{13}(N_D+Jii/q\ v_{sat}))^{-0.75}$$

This equation is described in J. Baliga, "Power Semiconductor Devices", PWS Publishing Company, 1996.

The rated current density of the diode $J_F$ is set, leaving a certain leeway, usually at one third the current density Jii which causes impact ionization such that avalanche breakdown is caused at the current density three times as high as the rated current density $J_F$. The breakdown voltage BV and the rated current density $J_F$ are related with each other by the following equation:

$$BV=1.06\times10^{14}(N_D+3J_F/q\ v_{sat})^{-0.75}$$

Then, the distance index L is calculated using the equation (4). For example, by setting BV at 1200 V (avalanche voltage), $N_D$ at $8.4\times0^{13}$ cm$^{-3}$, and the carrier saturation velocity $v_{sat}$ at $1\times10^7$ cm/s, the rated current density $J_F$ calculated by the equation described above is 170 A/cm$^2$. The distance index L calculated by substituting these figures to the equation (4) is 64 μm. Naturally, the distance index L depends on the breakdown voltage BV, the rated current density $J_F$, the impurity concentration $N_D$, and the saturation velocity $v_{sat}$.

Figure 6:
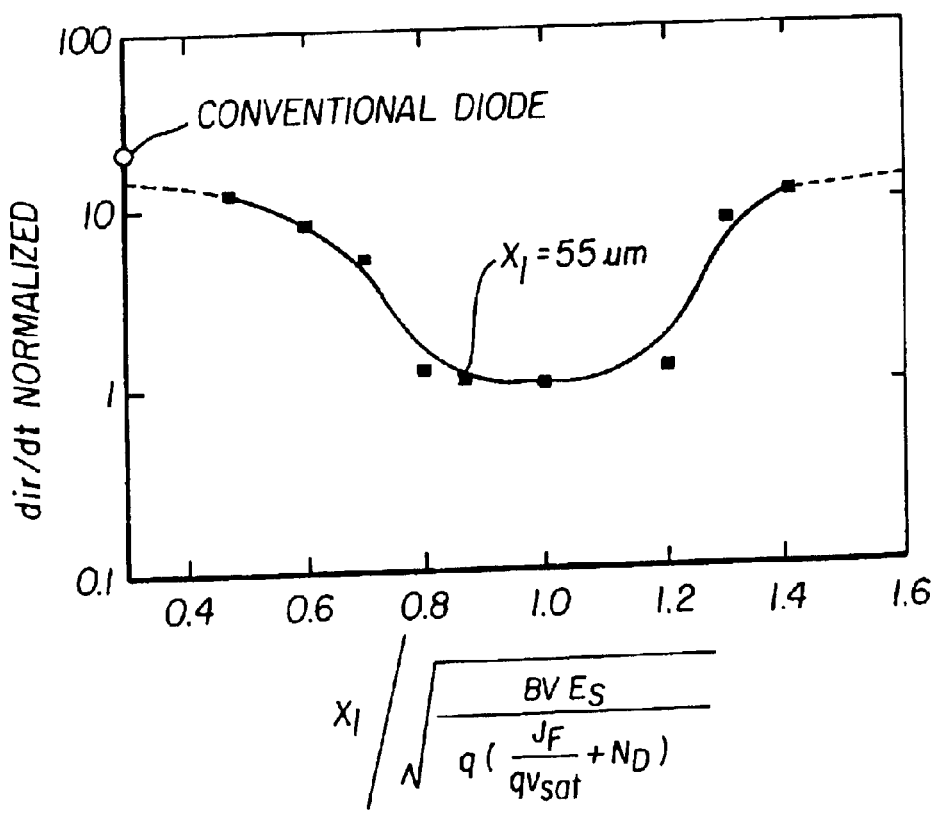
FIG. 6 is a graph describing the relation between the degree of soft recovery and the shortest distance $X_1$ from the pn-junction to the n-type buffer layer with the distance index L as a reference.

FIG. 6 is a graph describing the relation between the degree of soft recovery and the shortest distance $X_1$ from the pn-junction to the n-type buffer layer with the distance index L as a reference. In FIG. 6, the horizontal axis represents the ratio of $X_1$ and L, and the vertical axis the reverse-recovery-current reduction-rate (dir/dt). Soft recovery is realized when the reduction rate (dir/dt) is small. The n-type drift laminate is 115 μm in thickness. The vertical axis is normalized by the value of (dir/dt), at which $X_1$ is equal to the distance index L, that is $X_1/L=1.0$. The reverse-recovery-current reduction-rate (dir/dt) for the conventional pin diode is 20 times as high as that for the present pin diode. The reverse-recovery-current reduction-rate (dir/dt) is defined by the value, at which the gradient exhibits the maximum.

As FIG. 6 indicates, the present pin diode which includes an n-type buffer layer suppresses the reduction rate (dir/dt) more effectively than by the conventional pin diode. When $X_1/L$ is in the range between 0.3 and 1.6, the present pin diode effectively suppresses reduction rate (dir/dt). When $X_1/L$ is equal to 1, the reduction rate (dir/dt) is the smallest. When $X_1/L$ is in the range between 0.8 and 1.2, the reduction rate (dir/dt) is small enough not to cause oscillation but to realize soft recovery. The broken lines in FIG. 6 represent the estimated values.

As described so far, the present pin diode includes an n-type buffer layer between n-type drift layers. Since the n-type buffer layer suppresses the expansion of the space charge region, the electric field strength on the pn-junction rises. Therefore, it is necessary to adjust the position and the thickness of the n-type buffer layer so that the breakdown voltage BV of the diode may not be reduced.

For preventing the breakdown voltage BV of the diode from lowering, it is necessary to design the device structure such that the n-type buffer layer is depleted when a reverse bias voltage is applied, and such that the space charge region expands beyond the n-type buffer layer.

By optimally designing the device structure as described above, the breakdown voltage BV as high as that of the conventional pin diode is obtained, since the n-type drift layer between the n-type buffer layer and the cathode layer is also depleted. The thickness W of the n-type buffer layer calculated under the condition, under which the space charge region expands beyond the n-type buffer layer at the reverse bias voltage of half the breakdown voltage BV of the diode, is expressed by the following equation (5):

$$W=[X_1^2+2\epsilon_s(V_{CC}+V_{PT})/q\ N_{D2}]^{1/2}-X_1 \qquad (5),$$

where $V_{CC}$ is the half value of the breakdown voltage of the diode, $V_{PT}$ the voltage, at which the depletion layer contacts the buffer layer of the first conductivity type, and $N_{D2}$ the average impurity concentration in the buffer layer of the first conductivity type. Hereinafter, the thickness W described by the equation (5) is used as a thickness index indicating the thickness of the n-type buffer layer. The average impurity concentration $N_{D2}$ in the buffer layer of the first conductivity type (n-type) is the concentration obtained by integrating the impurity concentration across the n-type buffer layer and by dividing the integral concentration with the thickness $Y_1$ of the n-type buffer layer.

Figure 7:
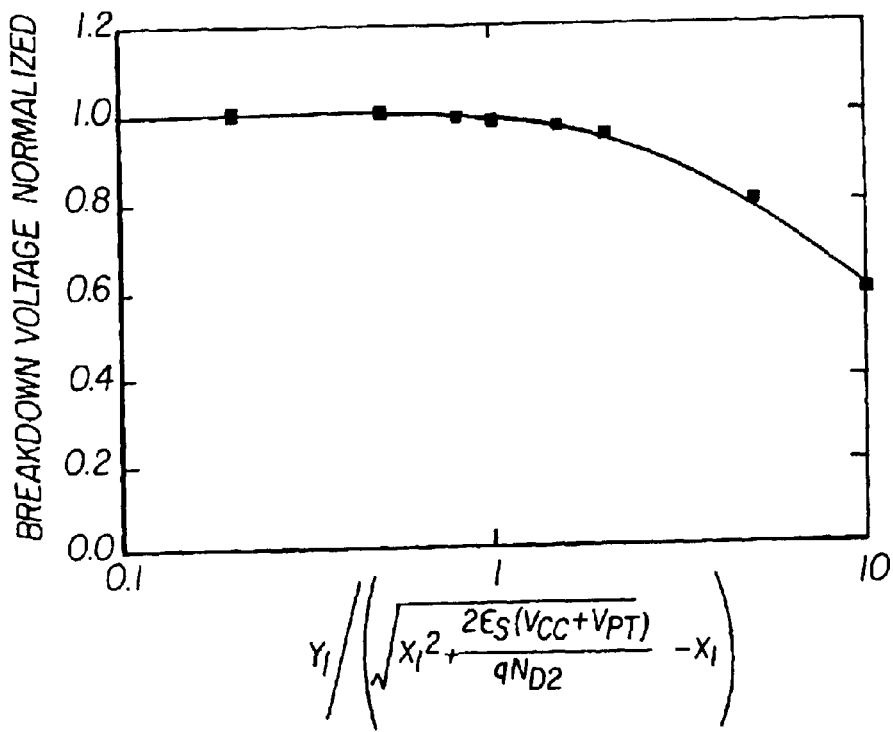
FIG. 7 is a graph relating the ratio $Y_1/W$ and the breakdown voltage BV of the pin diode.

FIG. 7 is a graph relating the ratio $Y_1/W$ and the breakdown voltage BV of the diode. In FIG. 7, $Y_1$ is the thickness of the n-type buffer layer of the practical diode. In the figure, the horizontal axis represents the ratio $Y_1/W$, and the horizontal axis the breakdown voltage BV normalized by the breakdown voltage of the conventional pin diode. As described in FIG. 7, the breakdown voltage BV lowers sharply at the ratio $Y_1/W$ larger than 2. Therefore, when the thickness $Y_1$ and the impurity concentration $N_{D2}$ in the n-type buffer layer are set at respective values, at which the ratio $Y_1/W$ is equal to or lower than 2, the breakdown voltage BV is sufficiently high.

Figure 8:
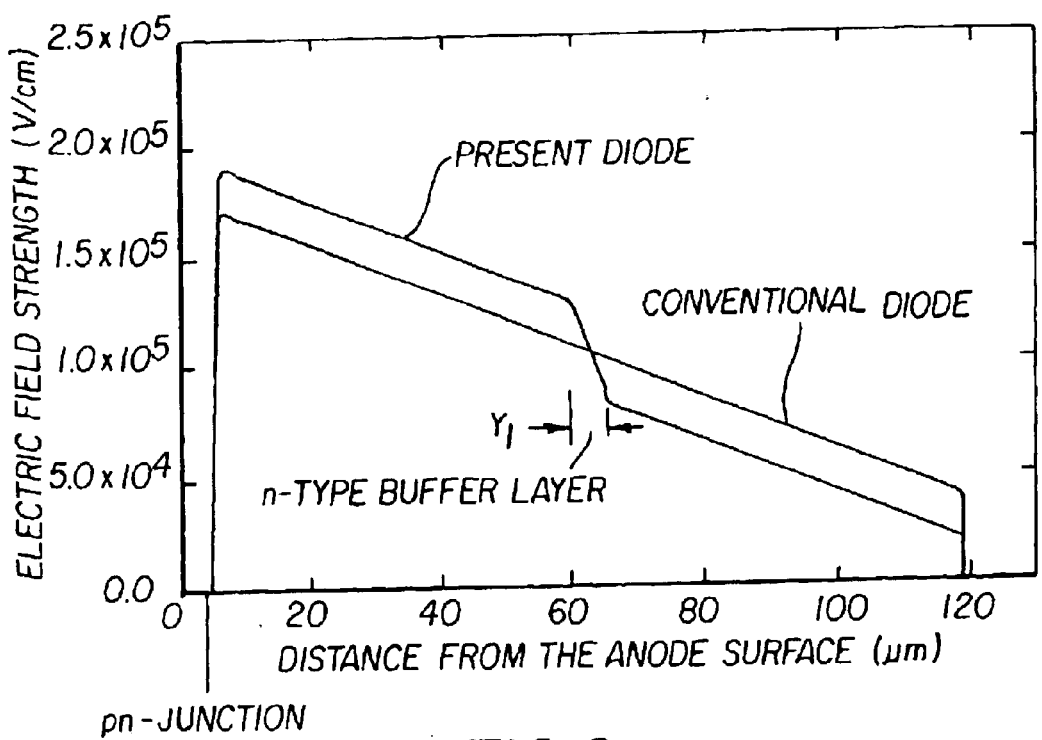
FIG. 8 is a pair of curves comparing the electric field strength distributions under the applied reverse bias voltage in the pin diode according to the first embodiment of the invention, in which the ratio $Y_1/W$ is equal to 1, and the conventional pin diode.

FIG. 8 is a pair of curves comparing the electric field strength distributions under the applied reverse bias voltage in the present pin diode, in which the ratio $Y_1/W$ is equal to 1, and the conventional pin diode. The applied voltage is 1200 V, which is the voltage (breakdown voltage), at which avalanche is caused in the present pin diode. The electric field strength is a little bit higher in the present pin diode, in which the ratio $Y_1/W$ is 2 or smaller, than in the conventional pin diode. However, since the n-type buffer layer in the present pin diode is depleted, the space charge region reaches the n-type cathode layer, and the breakdown voltage is sustained by the n-type drift laminate.

Figure 9:
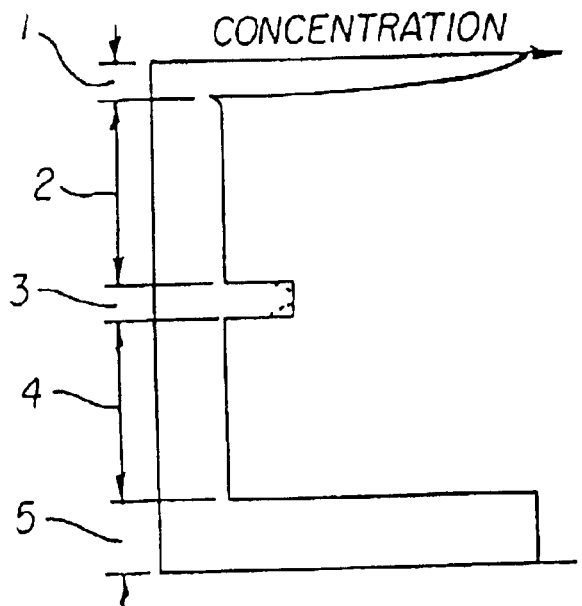
FIG. 9 shows the impurity distribution profile across the pin diode shown in FIG. 1.

FIG. 9 shows the impurity distribution profile across the present pin diode shown in FIG. 1. In FIG. 9, the impurity concentration exhibiting a step like distribution across n-type buffer layer 3 is represented by the solid line, and the impurity concentration exhibiting a distribution gradually changing across n-type buffer layer 3 is represented by the broken line. The impurity concentration in p-type anode layer is the p-type impurity concentration, and the impurity concentrations in first n-type drift layer 2, n-type buffer layer 3, second n-type drift layer 4 and n-type cathode layer 5 are the n-type impurity concentrations.

The step like impurity distribution is obtained by the thermal treatment conducted at a relatively low temperature. The gradually changing impurity distribution is obtained by epitaxial growth, by the thermal treatment conducted at a relatively high temperature and for a long period of time, or by ion implantation and subsequent thermal drive. When the impurity concentration exhibits a gradually changing distribution as illustrated by the broken line, the equation (5) is employable by using the average impurity concentration.

Figure 10:
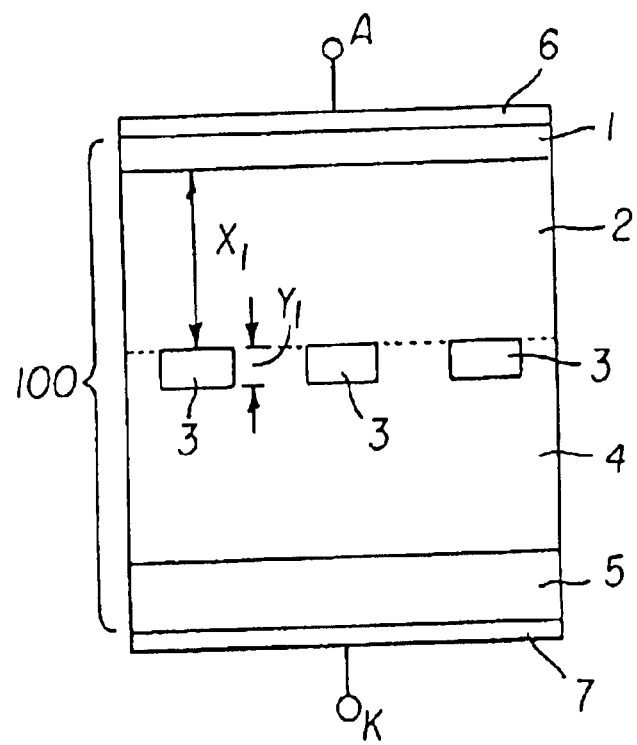
FIG. 10 is a cross sectional view of a semiconductor device according to the second embodiment of the invention.

FIG. 10 is a cross sectional view of a semiconductor device according to a second embodiment of the invention. Referring now to FIG. 10, the semiconductor device (pin diode) according to the second embodiment is different from the semiconductor device (pin diode) according to the first embodiment in that the pin diode according to the second embodiment includes a plurality of selectively formed n-type buffer regions 3. The impurity distribution profile across any of n-type buffer regions 3 is the same with that shown by the broken line in FIG. 9. The shapes of n-type buffer region 3 will be described later with reference to FIGS. 13 through 23.

Since the portions of second n-type drift layer 4 between n-type buffer regions 3 are very resistive, depletion layer expands easily across the portions of second n-type drift layer 4 between n-type buffer regions 3. Therefore, a high breakdown voltage is obtained easily. The semiconductor structure shown in FIG. 10 is obtained by conducting epitaxial growth twice. After n-type drift layer (second n-type drift layer 4) is formed by the first epitaxial growth, n-type buffer regions 3 are formed by implanting, for example, P (phosphorus) ions selectively and by thermally treating the implanted P ions. Then, first n-type drift layer 2 is formed by the second epitaxial growth. In short, n-type buffer regions 3 are formed by selective ion implantation and by the subsequent thermal drive.

By setting the ratios $X_1/L$ and $Y_1/W$ at the respective values in the same manner as according to the first embodiment, the same effects as obtained according to the first embodiment are obtained by the pin diode according to the second embodiment. The breakdown voltage BV of the pin diode according to the second embodiment is higher than that of the pin diode according to the first embodiment shown in FIG. 1, since the depletion layer expands easily across the portions of second n-type drift layer 4 between n-type buffer regions 3.

FIG. 11(a) is a cross sectional view of a semiconductor device according to a third embodiment of the invention. FIG. 11(b) shows the impurity distribution profile across the semiconductor device shown in FIG. 11(a). Referring now to FIG. 11(a), the semiconductor device (pin diode) according to the third embodiment is different from the semiconductor device (pin diode) according to the first embodiment in that the n-type buffer layer in the pin diode according to the third embodiment is formed of first buffer regions and second buffer regions, the impurity concentrations thereof are different from each other, and the first buffer regions and the second buffer regions are arranged alternately. In detail, n-type buffer layer 3 is formed of first buffer regions 31, the impurity concentration thereof is high, and second buffer regions 32, the impurity concentration thereof is lower than the impurity concentration of first buffer regions 31. Although a step like impurity distribution profile is shown in FIG. 11(b), the impurity concentration may be provided with a gradually changing distribution profile.

By setting the ratios $X_1/L$ and $Y_1/W$ at the respective values in the same manner as according to the first embodiment, the same effects as obtained according to the first embodiment are obtained by the pin diode according to the third embodiment. However, the breakdown voltage BV of the pin diode according to the third embodiment is between those of the pin diodes according to the first and second embodiments shown in FIGS. 1 and 10, respectively.

FIG. 12(a) is a cross sectional view of a semiconductor device according to a fourth embodiment of the invention. FIG. 12(b) shows the impurity distribution profile across the semiconductor device shown in FIG. 12(a). Referring back to FIG. 12(a), the semiconductor device (pin diode) according to the fourth embodiment is different from the semiconductor device (pin diode) according to the first embodiment in that the impurity concentration in second n-type drift region 4 on the cathode side is higher than the in first n-type drift region 2 on the anode side. In other words, first n-type drift region 2 on the anode side is more resistive than second n-type drift region 4 on the cathode side. The impurity distribution profile across the pin diode according to the fourth embodiment is either stepwise or gradually changing.

The semiconductor structure shown in FIGS. 12(a) and 12(b) effectively stops the depletion layer, which has expanded across first n-type drift layer 2 and n-type buffer layer 3, within second n-type drift layer 4. Therefore, the pin diode according to the fourth embodiment facilitates obtaining a breakdown voltage higher than that of the pin diode according to the first embodiment. By setting the ratios $X_1/L$ and $Y_1/W$ at the respective values in the same manner as according to the first embodiment, the same effects as obtained according to the first embodiment are obtained by the pin diode according to the fourth embodiment. Alternatively, n-type buffer layer 3 may be formed of a plurality of regions as shown in FIG. 10 or 11.

Figure 13A:
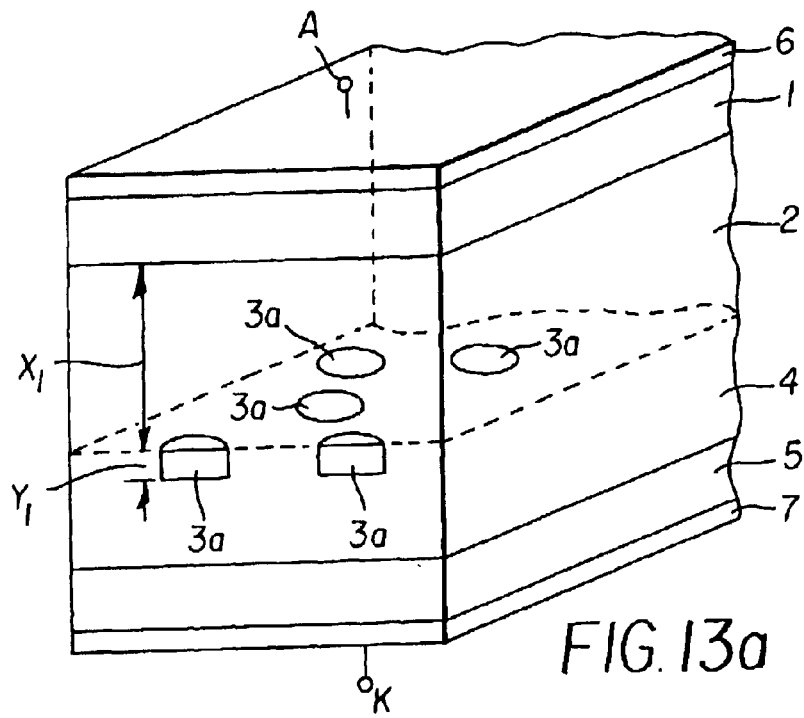
FIG. 13(a) is a perspective view of the semiconductor device shown in FIG. 10 for explaining the shape of the n-type buffer regions thereof.
Figure 13B:
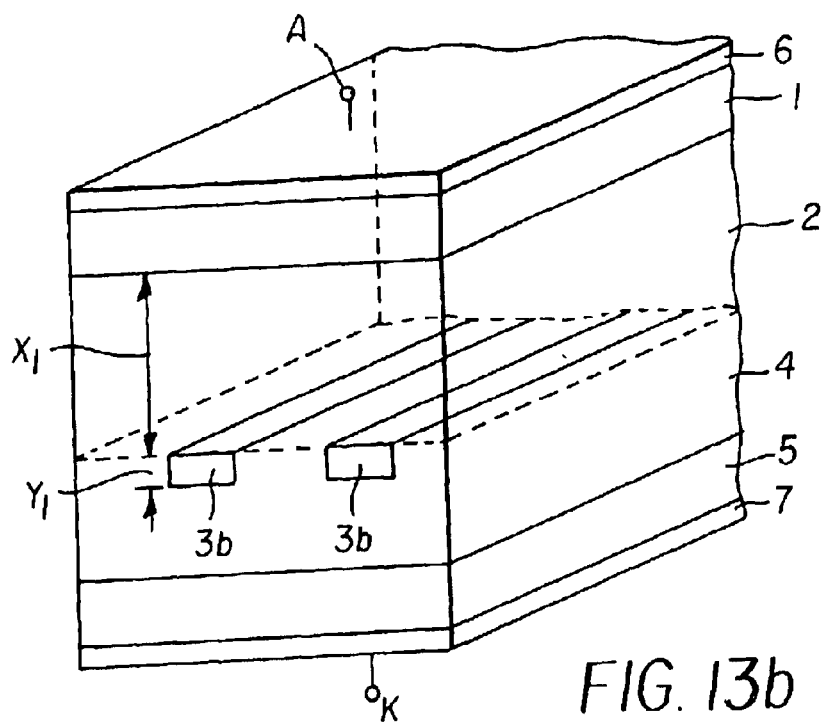
FIG. 13(b) is a perspective view of the semiconductor device shown in FIG. 10 for explaining the other shape of the n-type buffer regions thereof.

FIG. 13(a) is a perspective view of the semiconductor device shown in FIG. 10 for explaining the shape of the n-type buffer regions thereof. FIG. 13(b) is a perspective view of the semiconductor device shown in FIG. 10 for explaining the other shape of the n-type buffer regions thereof. Referring back to FIG. 13(a), n-type buffer regions 3a are scattered like dots. In other words, n-type buffer regions 3a are shaped with respective islands. Referring now to FIG. 13(b), n-type buffer regions 3b are shaped with respective stripes. Regardless of whether n-type buffer layer 3 is formed of island-shaped regions 3a or stripe-shaped regions 3b, a high breakdown voltage is obtained and the tradeoff relation between the fast and low-loss reverse recovery and the soft recovery is reduced by setting the ratios $X_1/L$ and $Y_1/W$ within the respective ranges described with reference to FIGS. 6 and 7.

Figure 14A:
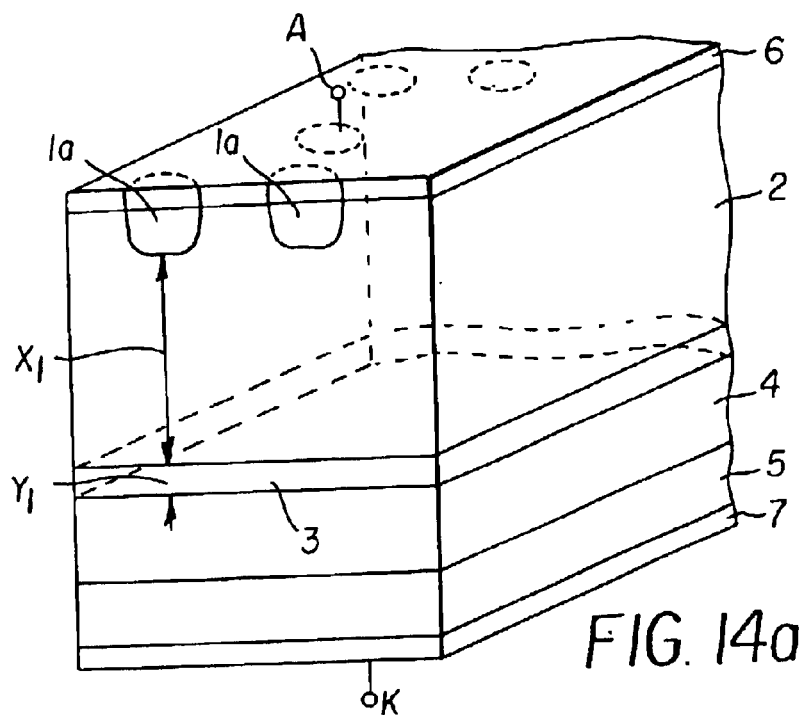
FIG. 14(a) is a perspective view of a diode according to the fifth embodiment of the invention having an island-shaped MPS structure and including a drift laminate including the n-type buffer layer as provided to the diode according to the first embodiment.
Figure 14B:
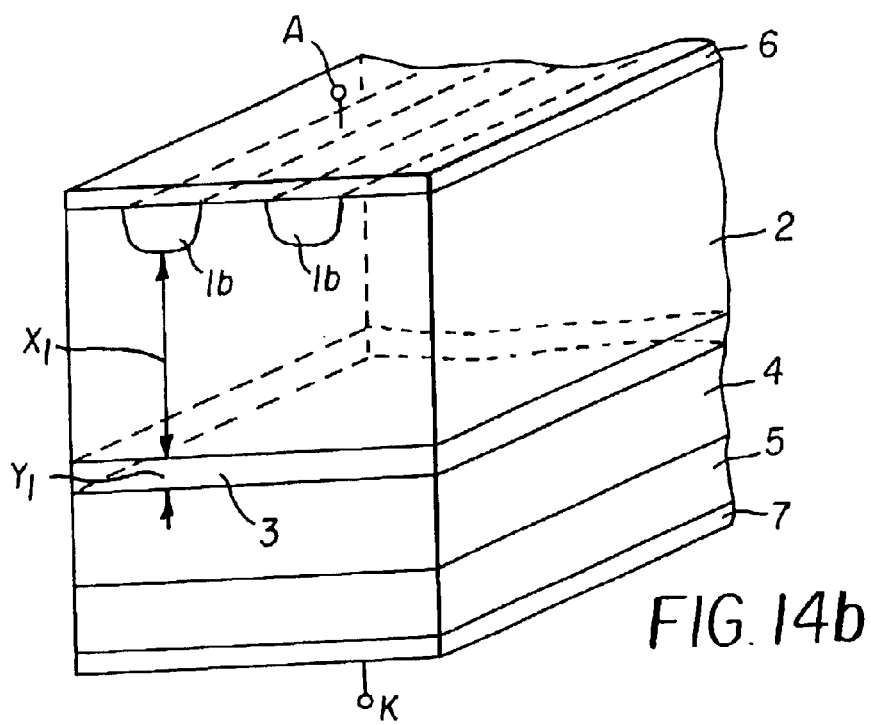
FIG. 14(b) is a perspective view of another diode according to the fifth embodiment of the invention having a stripe-shaped MPS structure and including a drift laminate including the n-type buffer layer as provided to the diode according to the first embodiment.

FIG. 14(a) is a perspective view of a diode according to a fifth embodiment of the invention having an island-shaped MPS structure and including a drift laminate including the n-type buffer layer as provided to the diode according to the first embodiment. FIG. 14(b) is a perspective view of another diode according to the fifth embodiment of the invention having a stripe-shaped MPS structure and including a drift laminate including the n-type buffer layer as provided to the diode according to the first embodiment. In FIG. 14(a), the MPS structure includes a plurality of island-shaped p-type anode regions 1a. In FIG. 14(b), the MPS structure includes a plurality of stripe-shaped p-type anode regions 1b. Schottky junctions are formed between an anode electrode 6 and the surfaces of the portions of a first drift layer 2 between island-shaped p-type anode regions 1a or stripe-shaped p-type anode regions 1b.

Since the minority carries from the anode side is reduced by the MPS structure, soft recovery is realized more easily than by the diode according to the first embodiment. Therefore, the diode according to the fifth embodiment facilitates obtaining a high breakdown voltage and reducing the tradeoff relation between the fast and low-loss reverse recovery and the soft recovery more effectively than the diode according to the first embodiment by setting the ratios $X_1/L$ and $Y_1/W$ within the respective ranges described with reference to FIGS. 6 and 7.

Figure 15A:
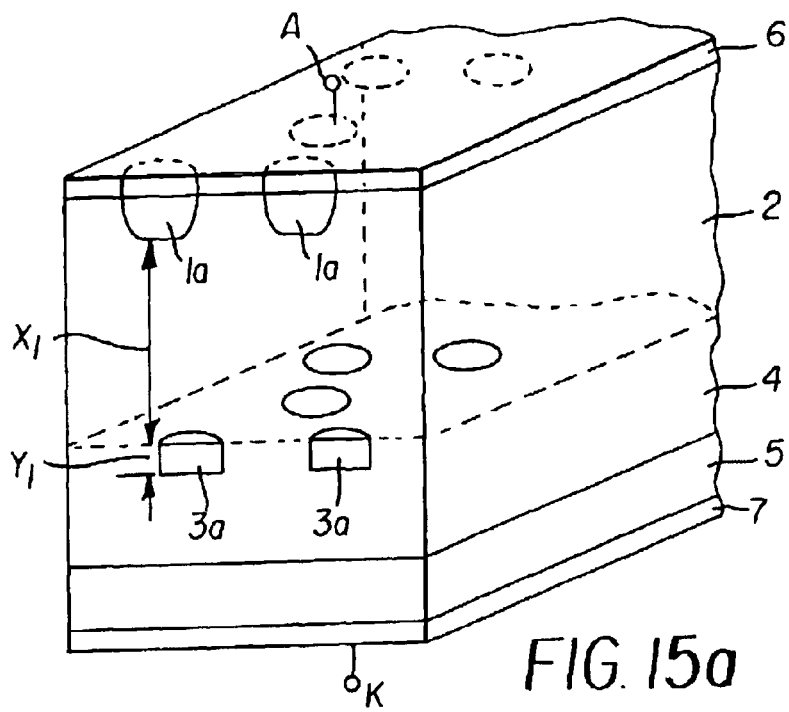
FIG. 15(a) is a perspective view of a diode according to the sixth embodiment of the invention having the island-shaped MPS structure as shown in FIG. 14(a) and including a drift laminate including the island-shaped n-type buffer regions as shown in FIG. 13(a).
Figure 15B:
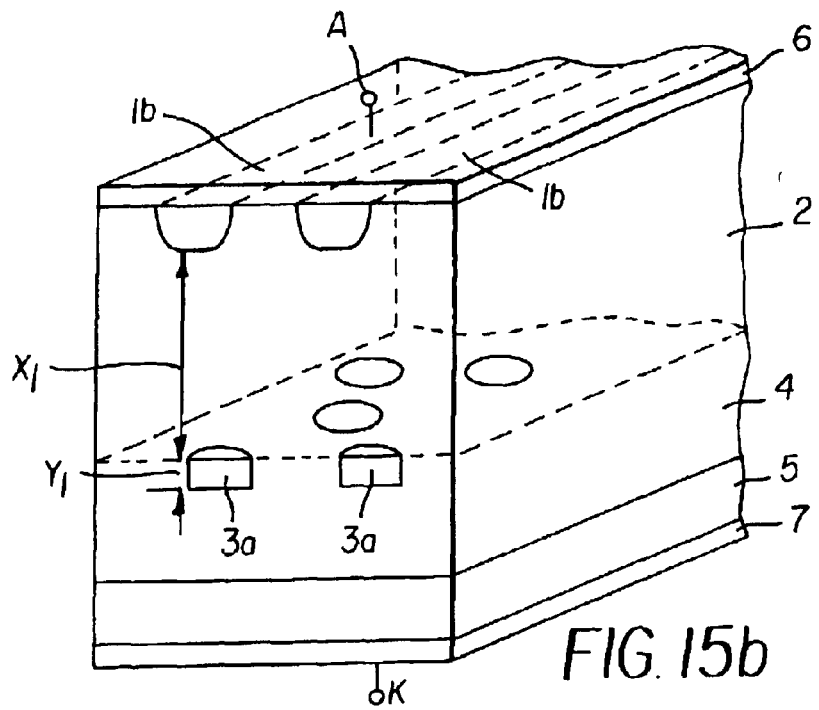
FIG. 15(b) is a perspective view of another diode according to the sixth embodiment of the invention having the stripe-shaped MPS structure as shown in FIG. 14(b) and including a drift laminate including the island-shaped n-type buffer regions as shown in FIG. 13(a).

FIG. 15(a) is a perspective view of a diode according to a sixth embodiment of the invention having the island-shaped MPS structure as shown in FIG. 14(a) and including a drift laminate including the island-shaped n-type buffer regions as shown in FIG. 13(a). FIG. 15(b) is a perspective view of another diode according to the sixth embodiment of the invention having the stripe-shaped MPS structure as shown in FIG. 14(b) and including a drift laminate including the island-shaped n-type buffer regions as shown in FIG. 13(a). In FIG. 15(a), the MPS structure includes a plurality of island-shaped p-type anode regions 1a. In FIG. 15(b), the MPS structure includes a plurality of stripe-shaped p-type anode regions 1b. Since the minority carries from the anode side is reduced by the MPS structure, soft recovery is realized more easily than by the diode according to the second embodiment. Therefore, the diode according to the sixth embodiment facilitates obtaining a high breakdown voltage and reducing the tradeoff relation between the fast and low-loss reverse recovery and the soft recovery more effectively than the diode according to the second embodiment by setting the ratios $X_1/L$ and $Y_1/W$ within the respective ranges described with reference to FIGS. 6 and 7.

Figure 16:
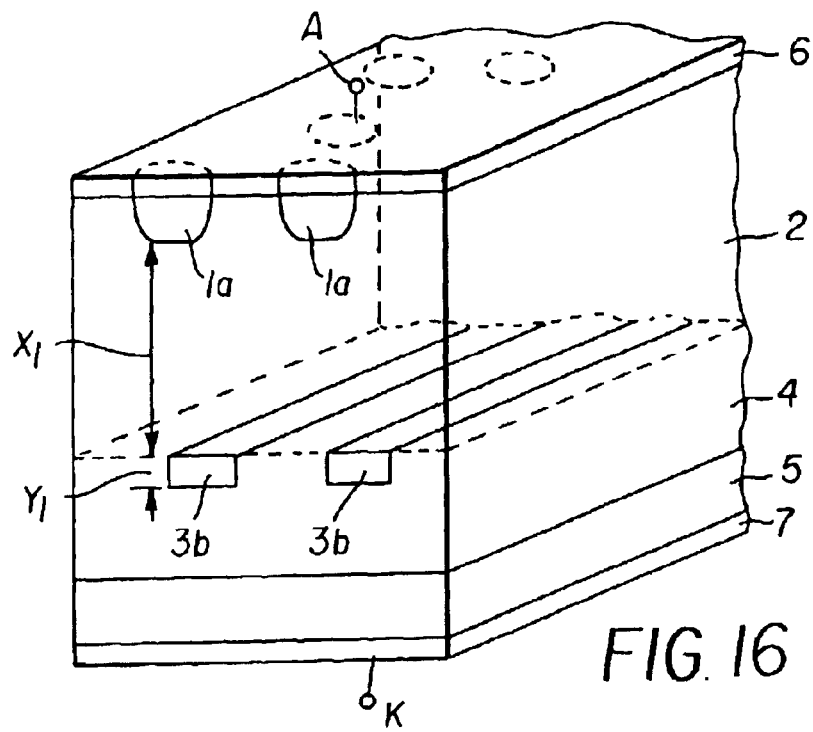
FIG. 16 is a perspective view of a diode according to the seventh embodiment of the invention having the island-shaped MPS structure as shown in FIG. 14(a) and including a drift laminate including the stripe-shaped n-type buffer regions as shown in FIG. 13(b).
Figure 17:
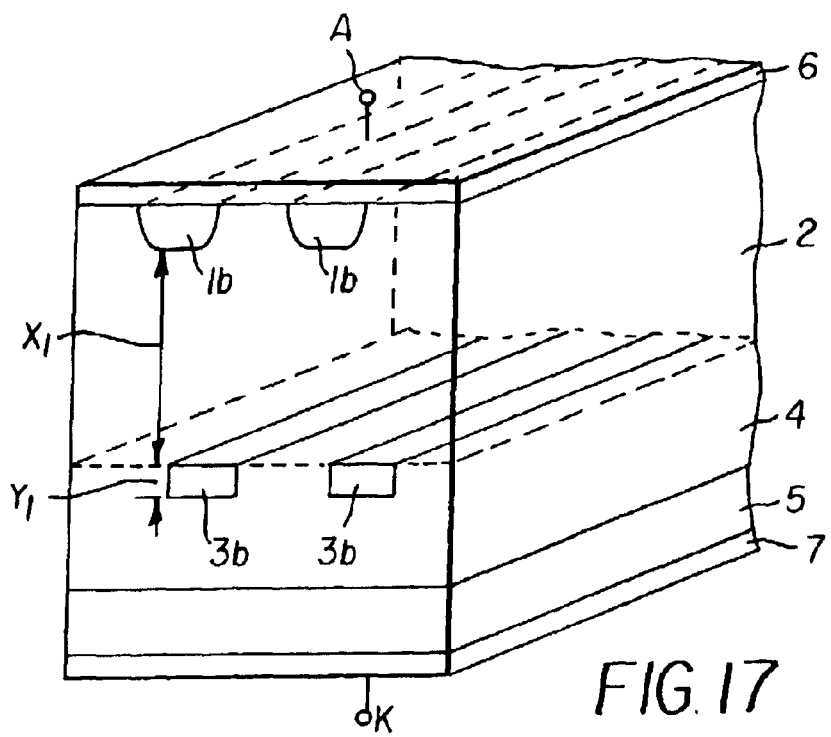
FIG. 17 is a perspective view of another diode according to the seventh embodiment of the invention having the stripe-shaped MPS structure as shown in FIG. 14(b) and including a drift laminate including the stripe-shaped n-type buffer regions as shown in FIG. 13(b).
Figure 18:
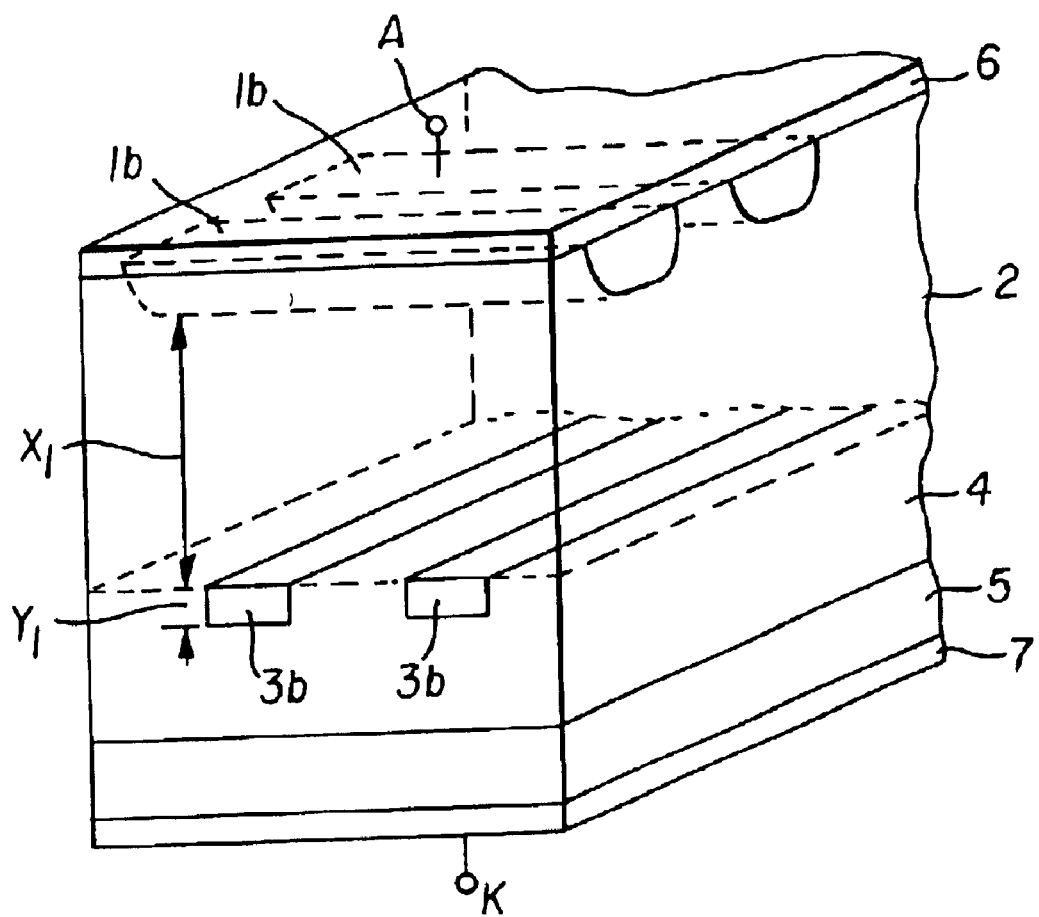
FIG. 18 is a perspective view of still another diode according to the seventh embodiment of the invention having the stripe-shaped MPS structure as shown in FIG. 14(b) and including a drift laminate including the stripe-shaped n-type buffer regions as shown in FIG. 13(b).

FIG. 16 is a perspective view of a diode according to a seventh embodiment of the invention having the island-shaped MPS structure as shown in FIG. 14(a) and including a drift laminate including the stripe-shaped n-type buffer regions as shown in FIG. 13(b). FIG. 17 is a perspective view of another diode according to the seventh embodiment of the invention having the stripe-shaped MPS structure as shown in FIG. 14(b) and including a drift laminate including the stripe-shaped n-type buffer regions as shown in FIG. 13(b). FIG. 18 is a perspective view of still another diode according to the seventh embodiment of the invention having the stripe-shaped MPS structure as shown in FIG. 14(b) and including a drift laminate including the stripe-shaped n-type buffer regions as shown in FIG. 13(b). In FIG. 16, the MPS structure includes a plurality of island-shaped p-type anode regions 1a. In FIG. 17, the MPS structure includes a plurality of stripe-shaped p-type anode regions 1b extending in parallel to the stripe-shaped n-type buffer regions. In FIG. 18, the MPS structure includes a plurality of stripe-shaped p-type anode regions 1b extending in perpendicular to the stripe-shaped n-type buffer regions. Alternatively, the stripes of p-type anode regions 1b and the stripes of the n-type buffer regions may be slant to each other.

Since the minority carries from the anode side is reduced by the MPS structure, soft recovery is realized more easily than by the diode according to the second embodiment. Therefore, the diode according to the seventh embodiment facilitates obtaining a high breakdown voltage and reducing the tradeoff relation between the fast and low-loss reverse recovery and the soft recovery more effectively than the diode according to the second embodiment by setting the ratios $X_1/L$ and $Y_1/W$ within the respective ranges described with reference to FIGS. 6 and 7.

The diode according to any of the following embodiments of the invention has an SFD structure including a thin p-type layer (thin p-type anode layer 1c), formed in substitution for the Schottky junction of the foregoing MPS structure, and an n-type drift laminate having any of the n-type buffer structures according to the foregoing embodiments. The p-type layer is formed in the following way. An anode electrode is formed by sputtering or by depositing under vacuum a metal containing a p-type acceptor element, e.g. Al, and the element of the semiconductor substrate, e.g. Si, such as Al-3%Si and Al-5%Si-0.5%Cu. Then, the as grown anode electrode layer is treated thermally in a hydrogen atmosphere or in a nitrogen atmosphere. Since a very thin p-type layer is formed in the surface portion of the anode electrode layer when a Schottky barrier is formed of an Al metal containing Si for example, the barrier is higher than that formed only of Al. Since the Al metal contains several % of Si, an epitaxial re-growth layer, which includes Al as an acceptor, is formed in the surface portion of the Si layer by the heat treatment. Therefore, the Schottky barrier formed as described above is high. The substantial Schottky barrier height rises with increase of the heat treatment temperature, since the thickness of the re-growth layer increases with increase of the heat treatment temperature. The heat treatment temperature is from 400 to 500° C. Observation by SIMS has confirmed that the epitaxial re-growth layer is around 120 Å in thickness and that the regrowth layer is a p-type layer, the Al (acceptor) concentration therein is around $10^{17}$ cm $^{-3}$. The barrier height of the Schottky junction including the thin p-type layer is higher by 10% than that of the Schottky junction not including any thin p-type layer. The high Schottky barrier is effective to reduce the leakage current. Due to the provision of the p-type layer, the on-voltage and the tradeoff relation between the fast and low-loss reverse recovery and the soft recovery are reduced.

Now the diodes having an SFD structure including a Schottky junction, therein a thin p-type layer is formed, according to the invention will be described hereinafter in connection with the embodiments thereof.

Figure 19A:
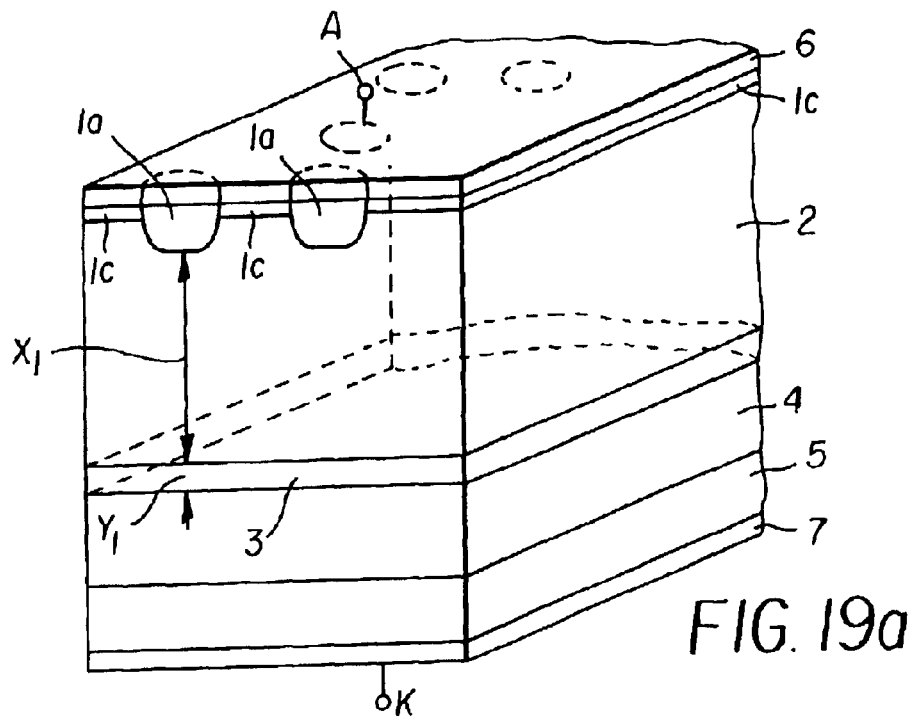
FIG. 19(a) is a perspective view of a diode according to the eighth embodiment of the invention having an island-shaped SFD structure and including a drift laminate including the n-type buffer layer as provided to the diode according to the first embodiment.
Figure 19B:
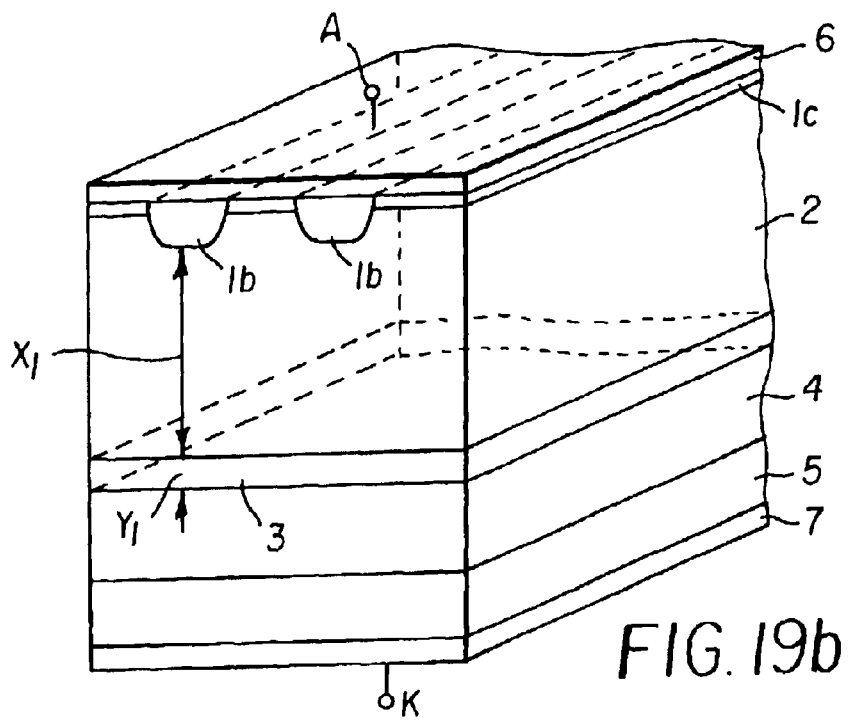
FIG. 19(b) is a perspective view of another diode according to the eighth embodiment of the invention having a stripe-shaped SFD structure and including a drift laminate including the n-type buffer layer as provided to the diode according to the first embodiment.

FIG. 19(a) is a perspective view of a diode according to an eighth embodiment of the invention having an island-shaped SFD structure and including a drift laminate including the n-type buffer layer as provided to the diode according to the first embodiment. FIG. 19(b) is a perspective view of another diode according to the eighth embodiment of the invention having a stripe-shaped SFD structure and including a drift laminate including the n-type buffer layer as provided to the diode according to the first embodiment. In FIG. 19(a), the SFD structure includes a plurality of island-shaped p-type anode regions 1a. In FIG. 19(b), the SFD structure includes a plurality of stripe-shaped p-type anode regions 1b.

Since the minority carries from the anode side is reduced by the SFD structure, soft recovery is realized more easily than by the diode according to the first embodiment. Therefore, the diode according to the eighth embodiment facilitates obtaining a high breakdown voltage and reducing the tradeoff relation between the fast and low-loss reverse recovery and the soft recovery more effectively than the diode according to the first embodiment by setting the ratios $X_1/L$ and $Y_1/W$ within the respective ranges described with reference to FIGS. 6 and 7.

Figure 20A:
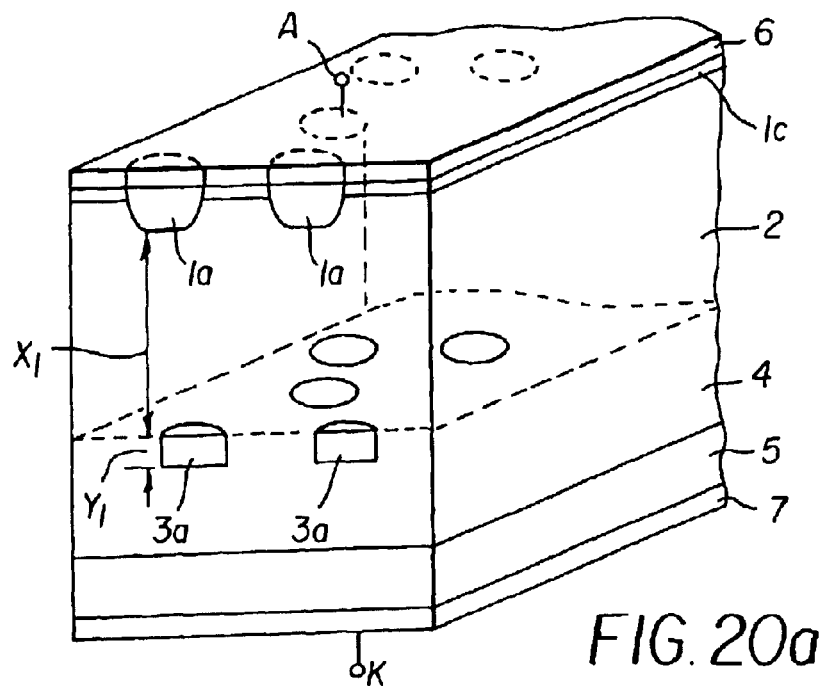
FIG. 20(*a*) is a perspective view of a diode according to the ninth embodiment of the invention having the SFD structure as shown in FIG. 19(*a*) and including a drift laminate including the island-shaped n-type buffer regions as shown in FIG. 13(*a*).
Figure 20B:
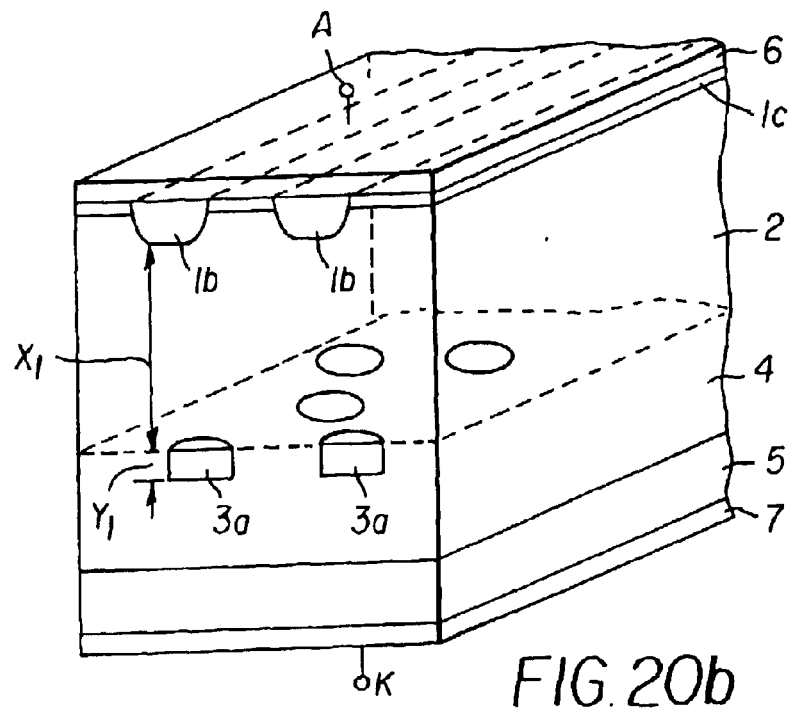

FIG. 20(a) is a perspective view of a diode according to a ninth embodiment of the invention having the SFD structure as shown in FIG. 19(a) and including a drift laminate including the island-shaped n-type buffer regions as shown in FIG. 13(a). FIG. 20(b) is a perspective view of another diode according to the ninth embodiment of the invention having the SFD structure as shown in FIG. 19(b) and including a drift laminate including the island-shaped n-type buffer regions as shown in FIG. 13(a). In FIG. 20(a), the SFD structure includes a plurality of island-shaped p-type anode regions 1a. In FIG. 20(b), the SFD structure includes a plurality of stripe-shaped p-type anode regions 1b.

Since the minority carries from the anode side is reduced by the SFD structure, soft recovery is realized more easily than by the diode according to the second embodiment. Therefore, the diode according to the ninth embodiment facilitates obtaining a high breakdown voltage and reducing the tradeoff relation between the fast and low-loss reverse recovery and the soft recovery more effectively than the diode according to the second embodiment by setting the ratios $X_1/L$ and $Y_1/W$ within the respective ranges described with reference to FIGS. 6 and 7.

Figure 21:
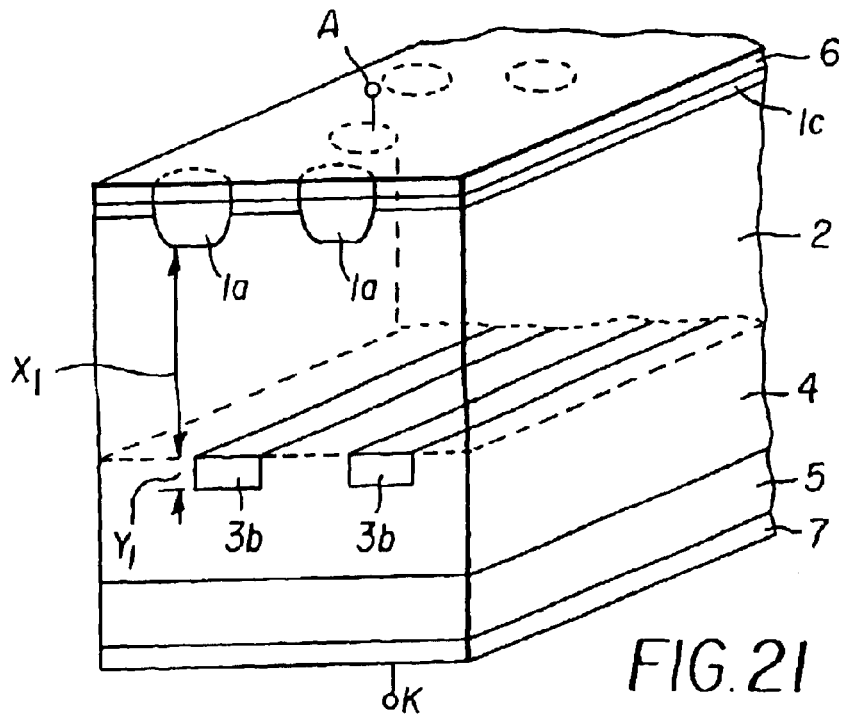
FIG. 21 is a perspective view of a diode according to the tenth embodiment of the invention having the SFD structure as shown in FIG. 19(*a*) and including a drift laminate including the stripe-shaped n-type buffer regions as shown in FIG. 13(*b*).
Figure 22:
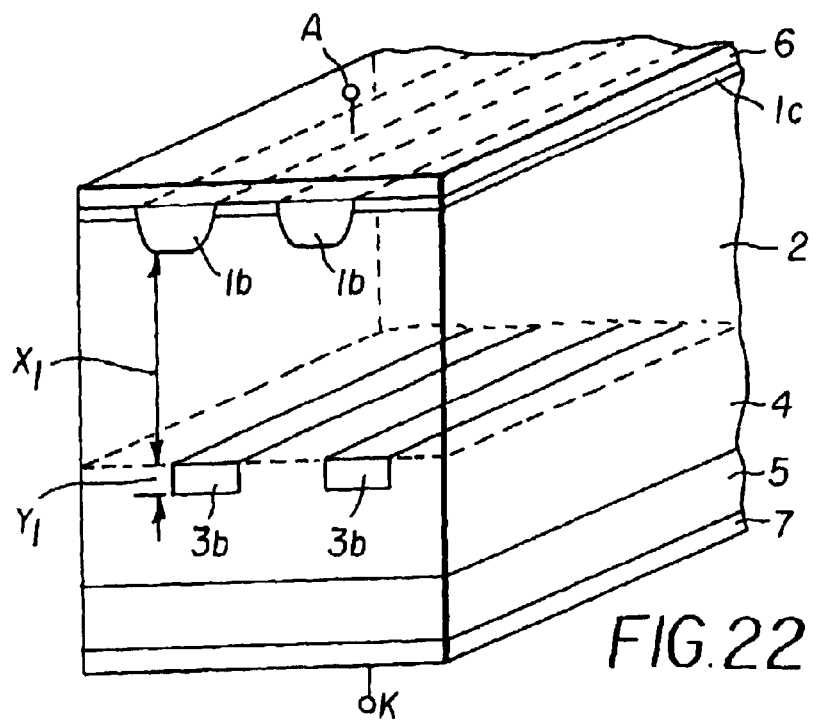
FIG. 22 is a perspective view of another diode according to the tenth embodiment of the invention having the SFD structure as shown in FIG. 19(*b*) and including a drift laminate including the stripe-shaped n-type buffer regions as shown in FIG. 13(*b*).
Figure 23:
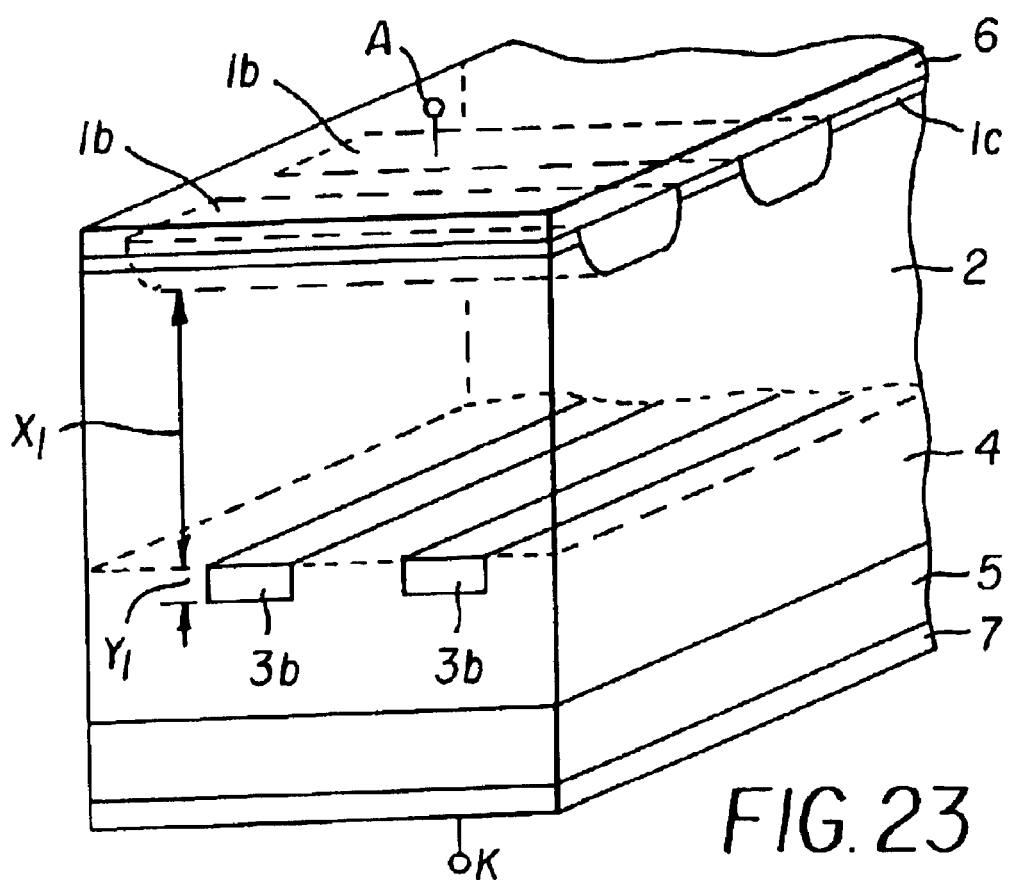
FIG. 23 is a perspective view of still another diode according to the tenth embodiment of the invention having the SFD structure as shown in FIG. 19(*b*) and including a drift laminate including the stripe-shaped n-type buffer regions as shown in FIG. 13(*b*).

FIG. 21 is a perspective view of a diode according to a tenth embodiment of the invention having the SFD structure as shown in FIG. 19(a) and including a drift laminate including the stripe-shaped n-type buffer regions as shown in FIG. 13(b). FIG. 22 is a perspective view of another diode according to the tenth embodiment of the invention having the SFD structure as shown in FIG. 19(b) and including a drift laminate including the stripe-shaped n-type buffer regions as shown in FIG. 13(b). FIG. 23 is a perspective view of still another diode according to the tenth embodiment of the invention having the SFD structure as shown in FIG. 19(b) and including a drift laminate including the stripe-shaped n-type buffer regions as shown in FIG. 13(b). In FIG. 21, the SFD structure includes a plurality of island-shaped p-type anode regions 1a. In FIG. 22, the SFD structure includes a plurality of stripe-shaped p-type anode regions 1b extending in parallel to the stripe-shape n-type buffer regions. In FIG. 23, the SFD structure includes a plurality of stripe-shaped p-type anode regions 1b extending in perpendicular to the stripe-shaped n-type buffer regions. Alternatively, the stripes of the p-type anode regions 1b and the stripes of the n-type buffer regions may be slant to each other.

Since the minority carries from the anode side is reduced by the SFD structure, soft recovery is realized more easily than by the diode according to the second embodiment. Therefore, the diode according to the tenth embodiment facilitates obtaining a high breakdown voltage and reducing the tradeoff relation between the fast and low-loss reverse recovery and the soft recovery more effectively than the diode according to the second embodiment by setting the ratios $X_1/L$ and $Y_1/W$ within the respective ranges described with reference to FIGS. 6 and 7.

Figure 24A:
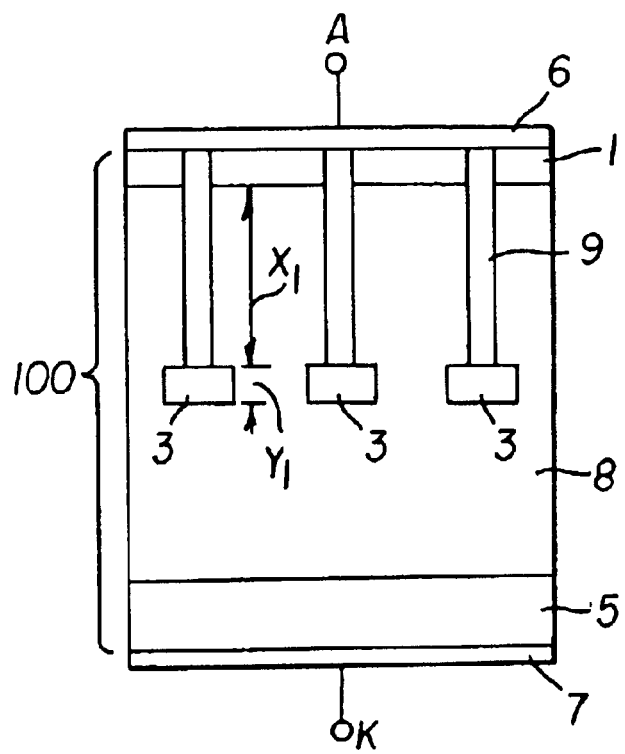
FIG. 24(*a*) is a cross sectional view of a semiconductor device according to the eleventh embodiment of the invention.
Figure 24B:
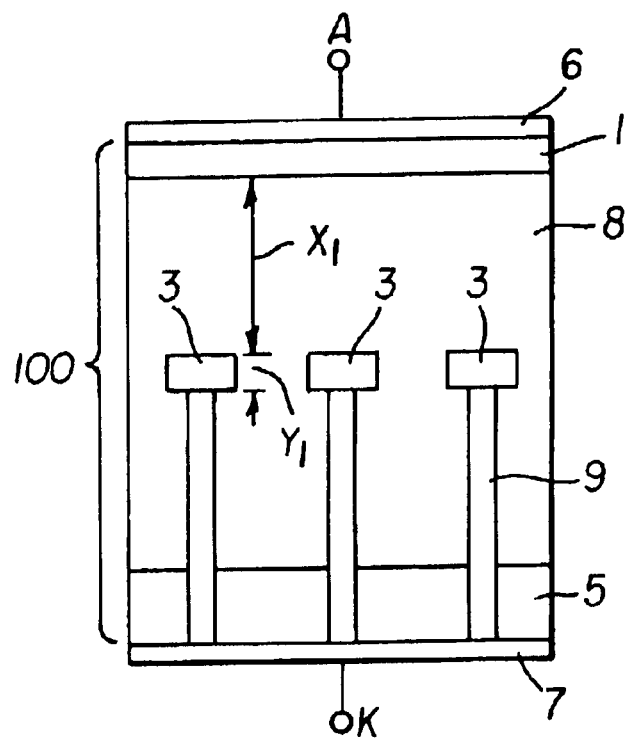

FIG. 24(a) is a cross sectional view of a semiconductor device according to an eleventh embodiment of the invention. FIG. 24(b) is a cross sectional view of another semiconductor device according to the eleventh embodiment of the invention. In FIG. 24(a), trenches are formed on the anode side. In FIG. 24(b), trenches are formed on the cathode side. These diodes are obtained by digging trenches 9, forming n-type buffer layers 3 in the bottom of the respective trenches, and filling the trenches with oxide films. By digging the trenches, n-type buffer layers are formed in an n-type drift layer 8 without employing epitaxial growth.

The diode according to the eleventh embodiment, which gas a trench structure, facilitates obtaining a high breakdown voltage and reducing the tradeoff relation between the fast and low-loss reverse recovery and the soft recovery in the same manner as the diode according to the second embodiment by setting the ratios $X_1/L$ and $Y_1/W$ within the respective ranges described with reference to FIGS. 6 and 7.

Although not illustrated, the tradeoff relation between the fast and low-loss reverse recovery and the soft recovery of a thyristor or a MOSFET is reduced by applying any of the foregoing buffer structures to the drift layer (very resistive layer) of the parasitic transistor included in the thyristor or the MOSFET.

Figure 26:
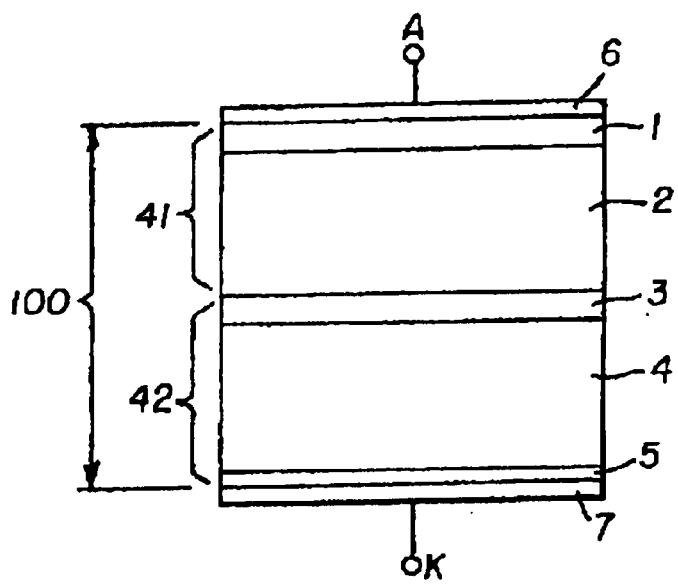
FIG. 26 is a cross sectional view of a semiconductor device according to the twelfth embodiment of the invention.

FIG. 26 is a cross sectional view of a semiconductor device according to a twelfth embodiment of the invention. The diode according to the twelfth embodiment is different from the diode according to the first embodiment shown in FIG. 1 in that n-type cathode layer 5 in the diode according to the twelfth embodiment is formed by ion implantation such that n-type cathode layer 5 is 1 $\mu$m or thinner in thickness, which is much thinner than n-type cathode layer 5, which is several tens thinner in thickness, of the diode according to the first embodiment shown in FIG. 1. The diode including such a thin n-type cathode layer as described above facilitates preventing lifetime killers from being introduced thereto and reducing the tradeoff relation between the fast and low-loss reverse recovery and the soft recovery more effectively than the diode according to the first embodiment.

Figure 27:
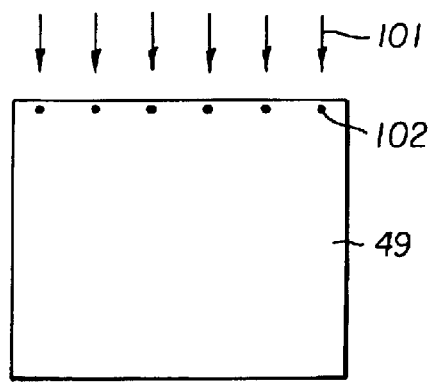
FIGS. 27 through 35 are cross sectional views describing the method of manufacturing a semiconductor device according to the thirteenth embodiment of the invention.
Figure 30:
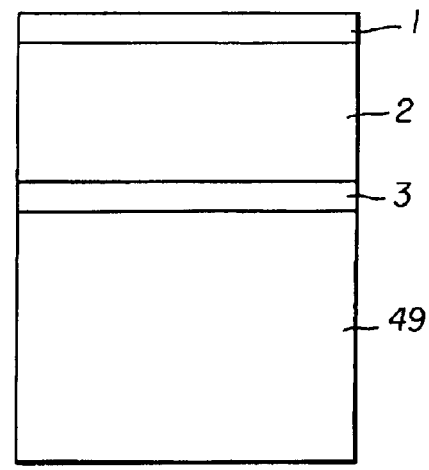
Figure 28:
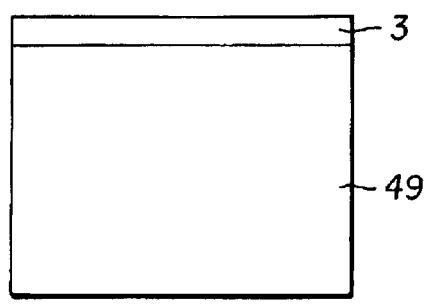
Figure 29:
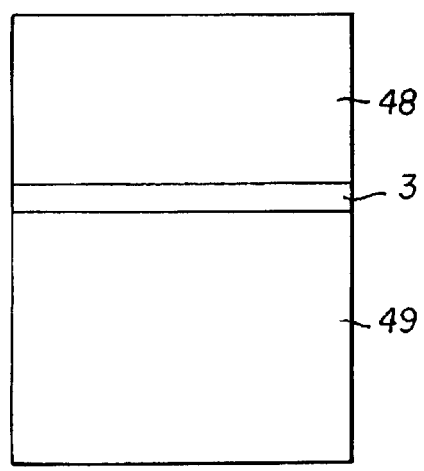
Figure 31:
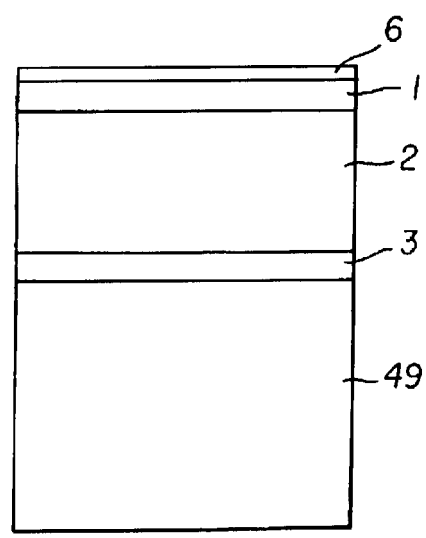
Figure 32:
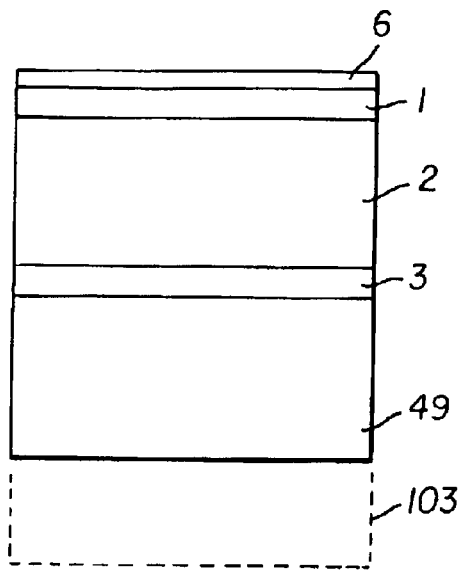
Figure 34:
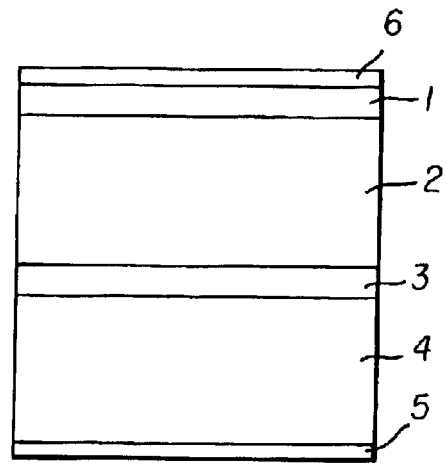
Figure 33:
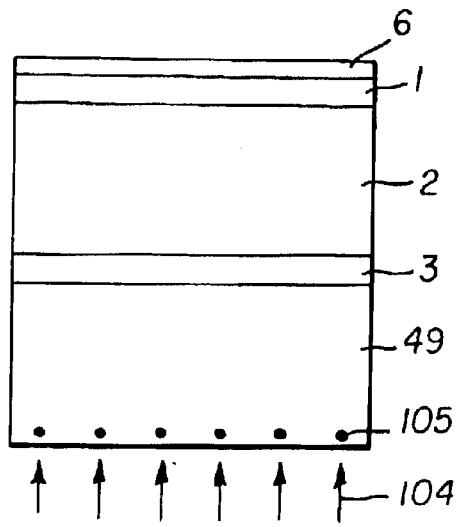
Figure 35:
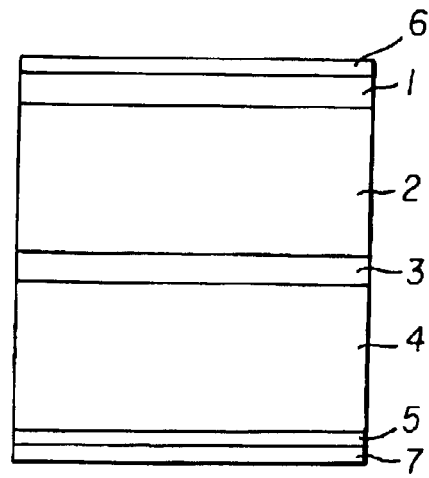

Now the method of manufacturing a semiconductor device according to according to a thirteenth embodiment of the invention will be described in connection with manufacture of the semiconductor device according to the twelfth embodiment. FIGS. 27 through 35 are cross sectional views describing the method of manufacturing a semiconductor device according to the thirteenth embodiment of the invention. Referring at first to FIG. 27, an n-type impurity 102 such as As is introduced by ion implantation 101 at the dose amount of from $1 \times 10^{11}$ to $5 \times 10^{11}$ cm$^{-2}$, 100 Kev into the surface portion of an n$^-$-type bulk wafer 49, the specific resistance thereof is 55 $\Omega$-cm. For example, bulk wafer 49 is an FZ wafer manufactured by the floating zone method. Bulk wafer 49 will be a second n-type drift layer 4 later. Referring now to FIG. 28, an n-type buffer layer 3 doped more heavily than n$^{31}$-type bulk wafer 49 is formed by heat treatment of more than 800° C. The n-type buffer layer 3 is 5 $\mu$m in thickness at this stage. Referring now to FIG. 29, a single crystal layer 48 containing phosphorus is grown epitaxially on n-type buffer layer 3. The specific resistance of epitaxially-grown single-crystal layer 48 is 55 $\Omega$-cm. The epitaxially-grown single-crystal layer 48 is 60 $\mu$m in thickness. The epitaxially-grown single-crystal layer 48 will be a first n-type drift layer 2 later. Referring now to FIG. 30, the surface of epitaxially-grown single-crystal layer 48 is treated by mirror finish. A thermal oxide film is formed on epitaxially-grown single-crystal layer 48, and the thermal oxide film is patterned. Then, an anode layer 1 of around 5 $\mu$m in thickness is formed by ion implantation (boron $1 \times 10^{13}$ cm$^{-2}$. Kev) and by subsequent thermal drive(1150° C. 3 hours). Referring now to FIG. 31, an anode electrode 6 is formed by sputtering Al—Si, and by patterning the Al—Si film. Then, a not shown protection film such as a nitride film is formed. Referring now to FIG. 32, the back surface of the bulk wafer 49 is polished by back grinding 103 such that the laminate is around 120 $\mu$m in thickness. Referring now to FIG. 32, an n-type impurity 105 such as phosphorus is introduced into the back surface of the polished laminate by ion implantation 104. Referring now to FIG. 33, an n-type impurity 105 is introduced by ion implantation 104 to the polished back surface of the bulk wafer 49. Referring now to FIG. 34, an n-type cathode layer 5 is formed by annealing the implanted n-type impurity 105 at a low temperature, for example 400° C., at which the Al—Si film is not deteriorated. The impurity concentration in n-type cathode layer 5 is $1 \times 10^{17}$ cm.$^{-3}$ or higher. The diffusion depth of n-type cathode layer 5 is 0.5 $\mu$m. Referring now to FIG. 35, a cathode electrode 7 is formed on n-type cathode layer 5.

The manufacturing method described above which uses the semiconductor substrate 100, obtained by forming single crystal layer 48 on bulk wafer 49 through one single step of epitaxial growth, facilitates reducing the manufacturing costs greatly. The semiconductor devices according to the first through twelfth embodiments are also manufactured at low costs by the manufacturing method described above.

The specific feature of the invention resides in that the diode having, for example, a pin structure includes an n-type buffer layer formed uniformly or selectively across a very resistive n-type drift layer working as an i-layer such that the n-type buffer layer is not in contact with a p-type anode layer nor with an n-type cathode layer. The specific resistance of the n-type buffer layer is lower than the specific resistance of the n-type drift layer and higher than the specific resistance of the n-type cathode layer. The n-type buffer layer is formed such that the shortest distance from the n-type buffer layer to the pn-junction is described by the relational expression (1) or (2). The n-type buffer layer is also formed such that the thickness and the average impurity concentration thereof are related with each other by the relational expression (3). By constructing a diode as described above, the diode conducts soft recovery, since the reverse recovery current does not oscillate even when the n-type drift layer is thin, and the breakdown voltage of the diode is not impaired. Since the space charge region expanding during reverse recovery stops once in the n-type buffer layer, the minority carriers in the portion of the n-type drift layer on the side of the anode layer are swept out quickly by the space charge region. The space charge region expands beyond the n-type buffer layer and a little bit into the portion of the n-type drift layer on the side of the cathode. However, the space charge region does not expand deeply into the portion of the n-type drift layer on the side of the cathode. Therefore, the minority carriers in the portion of the n-type drift layer on the side of the cathode layer are not swept out by the space charge region. The minority carriers vanish only by recombination. Since the amount of the carriers remaining in the diode according to the invention is larger than that in the conventional pin diode, which does not include any n-type buffer layer, the diode according to the invention facilitates suppressing the reverse-recovery-current reduction-rate at a low value and realizing soft recovery. Therefore, the thickness of the n-type drift laminate is reduced. As a result, the diode according to the invention facilitates soft and fast reverse recovery with low losses.

The provision of the n-type buffer layer does not impair the breakdown voltage of the diode according to the invention. The breakdown voltage of the diode according to the invention is almost the same with that of the conventional pin diode. Since the n-type buffer layer, formed as described by the relational expression (1) or (2) and the relational expression (3), is also depleted by the depletion layer expanding form the side of the anode, the applied voltage is sustained by the n-type drift laminate including the n-type buffer layer.

By forming an n-type buffer layer having a certain thickness at a certain location in an n-type drift layer, soft recovery can be realized even when the n-type drift layer is thin, and the tradeoff relation between the fast and low-loss reverse recovery and the soft recovery can be reduced. Since the semiconductor device according to the invention conducts soft recovery, electromagnetic radiation noises are hardly caused. Moreover, the semiconductor device according to the invention can be manufactured with low costs by using a bulk wafer such as an FZ wafer and by conducting epitaxial growth only once.

Given the disclosure of the present invention, one versed in the art would appreciate that there may be other embodiments and modifications within the scope and spirit of the present invention. Accordingly, all modifications attainable by one versed in the art from the present disclosure within the scope and spirit of the present invention are to be included as further embodiments of the present invention. The scope of the present invention accordingly is to be defined as set forth in the appended claims.

The disclosures of the priority applications, JP PA 2001-048631 and JP PA 2001-259928, in their entirety, including the drawings, claims, and the specifications thereof, are incorporated herein by reference.

What is claimed is:

1. A semiconductor device comprising:
    a drift layer of a first conductivity type having a first major surface and a second major surface;
    an anode layer of a second conductivity type on the first major surface of the drift layer, the anode layer being doped more heavily than the drift layer;
    a cathode layer of the first conductivity type on the second major surface of the drift layer, the cathode layer being doped more heavily than the drift layer; and
    a buffer layer of the first conductivity type extending across the drift layer, the buffer layer being spaced apart from the anode layer and the cathode layer, the buffer layer being doped more heavily than the drift layer,
    wherein the shortest distance $X_1$ from the pn-junction between the anode layer and the drift layer to the edge of the buffer layer on the side of the anode is expressed by the following relational expression:

$$0.3 \leq X_1 / \{(BV\ \epsilon_s)/q[(J_F/q\ v_{sat}) + N_D]\}^{1/2} \leq 1.6,$$

where BV is the breakdown voltage of the semiconductor device, $\epsilon_s$ is the dielectric permittivity of the semiconductor, q is the elementary charge quantity, $J_F$ is the rated current density of the semiconductor device, $v_{sat}$ is the carrier saturation velocity, and $N_D$ is the concentration of the impurity of the first conductivity type in the drift layer, and
    wherein a depletion layer extends from the pn junction to the cathode layer.

2. The semiconductor device according to claim 1, wherein the buffer layer comprises a plurality of regions.

3. The semiconductor device according to claim 2, wherein the buffer layer comprises a plurality of selectively formed island-shaped regions.

4. The semiconductor device according to claim 2, wherein the buffer layer comprises a plurality of selectively formed stripe-shaped regions.

5. The semiconductor device according to claim 1, wherein the impurity concentration in the portion of the drift layer between the anode layer and the buffer layer is lower than the impurity concentration in the portion of the drift layer between the cathode layer and the buffer layer.

6. The semiconductor device according to claim 1, wherein the thickness $Y_1$ of the buffer layer and the average impurity concentration $N_{D2}$ of the buffer layer are related with each other by the following relational expression:

$$Y_1 / \{[X_1^2 + 2\epsilon_s(V_{CC} + V_{PT})/q\ N_{D2}]^{1/2} - X_1\} \leq 2,$$

where $X_1$ is the shortest distance from the pn-junction between the anode layer and the drift layer to the edge of the buffer layer on the side of the anode, $V_{CC}$ is the half value of the breakdown voltage of the semiconductor device, $V_{PT}$ is the voltage, at which the depletion layer contacts the buffer layer of the first conductivity type, $\epsilon_s$ is the dielectric permittivity of the semiconductor, and q is the elementary charge quantity.

7. The semiconductor device according to claim 6, wherein the buffer layer comprises a plurality of regions.

8. The semiconductor device according to claim 7, wherein the buffer layer comprises a plurality of selectively formed island-shaped regions.

9. The semiconductor device according to claim 7, wherein the buffer layer comprises a plurality of selectively formed stripe-shaped regions.

10. The semiconductor device according to claim 6, wherein the impurity concentration in the portion of the drift layer between the anode layer and the buffer layer is lower than the impurity concentration in the portion of the drift layer between the cathode layer and the buffer layer.

11. A semiconductor device comprising:

a drift layer of a first conductivity type having a first major surface and a second major surface;

an anode layer of a second conductivity type on the first major surface of the drift layer, the anode layer being doped more heavily than the drift layer;

a cathode layer of the first conductivity type on the second major surface of the drift layer, the cathode layer being doped more heavily than the drift layer; and a buffer layer of the first conductivity type extending across the drift layer, the buffer layer being spaced apart from the anode layer and the cathode layer, the buffer layer being doped more heavily than the drift layer, wherein the shortest distance $X_1$ from the pn-junction between the anode layer and the drift layer to the edge of the buffer layer on the side of the anode is expressed by the following relational expression:

$$0.8 \leq X_1/\{(BV\,\epsilon_s)/q[(J_F/q\,v_{sat})+N_D]\}^{1/2} \leq 1.2,$$

where BV is the breakdown voltage of the semiconductor device, $\epsilon_s$ is the dielectric permittivity of the semiconductor, q is the elementary charge quantity, $J_F$ is the rated current density of the semiconductor device, $v_{sat}$ is the carrier saturation velocity, and $N_D$ is the concentration of the impurity of the first conductivity type in the drift layer, and wherein a depletion layer extends from the pn junction to the cathode layer.

12. The semiconductor device according to claim 11, wherein the buffer layer comprises a plurality of regions.

13. The semiconductor device according to claim 12, wherein the buffer layer comprises a plurality of selectively formed island-shaped regions.

14. The semiconductor device according to claim 12, wherein the buffer layer comprises a plurality of selectively formed stripe-shaped regions.

15. The semiconductor device according to claim 11, wherein the thickness $Y_1$ of the buffer layer and the average impurity concentration $N_{D2}$ of the buffer layer are related with each other by the following relational expression:

$$Y_1/\{[X_1^2+2\epsilon_s(V_{CC}+V_{PT})/q\,N_{D2}]^{1/2}-X_1\} \leq 2,$$

where $X_1$ is the shortest distance from the pn-junction between the anode layer and the drift layer to the edge of the buffer layer on the side of the anode, $V_{CC}$ is the half value of the breakdown voltage of the semiconductor device, $V_{PT}$ is the voltage, at which the depletion layer contacts the buffer layer of the first conductivity type, $\epsilon_s$ is the dielectric permittivity of the semiconductor, and q is the elementary charge quantity.

16. The semiconductor device according to claim 15, wherein the buffer layer comprises a plurality of regions.

17. The semiconductor device according to claim 16, wherein the buffer layer comprises a plurality of selectively formed island-shaped regions.

18. The semiconductor device according to claim 16, wherein the buffer layer comprises a plurality of selectively formed stripe-shaped regions.

19. The semiconductor device according to claim 15, wherein the impurity concentration in the portion of the drift layer between the anode layer and the buffer layer is lower than the impurity concentration in the portion of the drift layer between the cathode layer and the buffer layer.

20. The semiconductor device according to claim 11, wherein the impurity concentration in the portion of the drift layer between the anode layer and the buffer layer is lower than the impurity concentration in the portion of the drift layer between the cathode layer and the buffer layer.

21. A semiconductor device comprising:

a drift layer of a first conductivity type having a first major surface and a second major surface;

an anode layer of a second conductivity type on the first major surface of the drift layer, the anode layer being doped more heavily than the drift layer;

a cathode layer of the first conductivity type on the second major surface of the drift layer, the cathode layer being doped more heavily than the drift layer; and a buffer layer of the first conductivity type extending across the drift layer, the buffer layer being spaced apart from the anode layer and the cathode layer, the buffer layer being doped more heavily than the drift layer, wherein the thickness $Y_1$ of the buffer layer and the average impurity concentration $N_{D2}$ of the buffer layer are related with each other by the following relational expression:

$$Y_1/\{[X_1^2+2\epsilon_s(V_{CC}+V_{PT})/q\,N_{D2}]^{1/2}-X_1\} \leq 2,$$

where $X_1$ is the shortest distance from the pn-junction between the anode layer and the drift layer to the edge of the buffer layer on the side of the anode, $V_{CC}$ is the half value of the breakdown voltage of the semiconductor device, $V_{PT}$ is the voltage, at which the depletion layer contacts the buffer layer of the first conductivity type, $\epsilon_s$ is the dielectric permittivity of the smiconductor, and q is the elementary charge quantity, and wherein a depletion layer extends from the pn-junction to the cathode layer.

22. The semiconductor device according to claim 21, wherein the buffer layer comprises a plurality of regions.

23. The semiconductor device according to claim 22, wherein the buffer layer comprises a plurality of selectively formed island-shaped regions.

24. The semiconductor device according to claim 22, wherein the buffer layer comprises a plurality of selectively formed stripe-shaped regions.

25. The semiconductor device according to claim 21, wherein the impurity concentration in the portion of the drift layer between the anode layer and the buffer layer is lower than the impurity concentration in the portion of the drift layer between the cathode layer and the buffer layer.

* * * * *